United States Patent
Yoshimoto et al.

(10) Patent No.: US 9,484,090 B2
(45) Date of Patent: Nov. 1, 2016

(54) READ AND WRITE METHODS FOR A RESISTANCE CHANGE NON-VOLATILE MEMORY DEVICE

(71) Applicant: Panasonic Intellectual Property Management Co., Ltd., Osaka (JP)

(72) Inventors: Yuhei Yoshimoto, Hyogo (JP); Kazuhiko Shimakawa, Osaka (JP); Ken Kawai, Osaka (JP); Ryotaro Azuma, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/635,297

(22) Filed: Mar. 2, 2015

(65) Prior Publication Data

US 2015/0179251 A1     Jun. 25, 2015

Related U.S. Application Data

(63) Continuation of application No. PCT/JP2014/002715, filed on May 23, 2014.

(30) Foreign Application Priority Data

Jun. 6, 2013   (JP) .................. 2013-120253

(51) Int. Cl.
*G11C 13/00*     (2006.01)
*G11C 29/02*     (2006.01)
(Continued)

(52) U.S. Cl.
CPC ......... *G11C 13/004* (2013.01); *G11C 13/0002* (2013.01); *G11C 13/0007* (2013.01);
(Continued)

(58) Field of Classification Search
CPC . G11C 13/004; G11C 29/70; G11C 13/0023; G11C 29/028; G11C 29/026; G11C 29/021; G11C 13/0007; G11C 13/0002; H01L 27/2409; H01L 45/08; H01L 45/146; H01L 45/1253; H01L 45/1233; H01L 27/2481
See application file for complete search history.

(56) References Cited

U.S. PATENT DOCUMENTS

2008/0025072 A1   1/2008   Tamai et al.
2009/0003047 A1   1/2009   Toda
(Continued)

FOREIGN PATENT DOCUMENTS

JP   2008-034033   2/2008
JP   2009-009657   1/2009
(Continued)

OTHER PUBLICATIONS

International Search Report of PCT application No. PCT/JP2014/002715 dated Jul. 8, 2014.

*Primary Examiner* — Richard Elms
*Assistant Examiner* — Ajay Ojha
(74) *Attorney, Agent, or Firm* — McDermott Will & Emery LLP

(57) ABSTRACT

A selection circuit that selects a memory cell from a memory cell array and a read circuit for reading a resistance state of a resistance change element in the selected memory cell are provided. In memory cells of odd-numbered-layer and even-numbered-layer memory cell arrays that constitute a multi-layer memory cell array, each memory cell in any of the layers has a selection element, a first electrode, a first resistance change layer, a second resistance change layer, and a second electrode that are disposed in the same order. Whether the selected memory cell is located in any layer of the multilayer memory cell array, the read circuit applies a voltage to the selected memory cell to perform the reading operation. The voltage applied to the selected memory cell causes the second electrode to become positive with reference to the first electrode in the selected memory cell.

5 Claims, 17 Drawing Sheets

(51) Int. Cl.
  *G11C 29/00* (2006.01)
  *H01L 27/24* (2006.01)
  *H01L 45/00* (2006.01)
  *G11C 7/06* (2006.01)

(52) U.S. Cl.
  CPC ....... *G11C13/0023* (2013.01); *G11C 13/0061* (2013.01); *G11C 13/0069* (2013.01); *G11C 29/021* (2013.01); *G11C 29/026* (2013.01); *G11C 29/028* (2013.01); *G11C 29/70* (2013.01); *H01L 27/2409* (2013.01); *H01L 27/2481* (2013.01); *H01L 45/08* (2013.01); *H01L 45/1233* (2013.01); *H01L 45/1253* (2013.01); *H01L 45/146* (2013.01); *G11C 7/062* (2013.01); *G11C 2013/005* (2013.01); *G11C 2013/009* (2013.01); *G11C 2013/0054* (2013.01); *G11C 2013/0073* (2013.01); *G11C 2213/56* (2013.01); *G11C 2213/71* (2013.01); *G11C 2213/79* (2013.01)

(56) References Cited

U.S. PATENT DOCUMENTS

| | | | |
|---|---|---|---|
| 2010/0110766 A1* | 5/2010 | Wei | G11C 13/0007 365/148 |
| 2012/0099367 A1 | 4/2012 | Azuma et al. | |
| 2012/0236628 A1* | 9/2012 | Ikeda | G11C 13/0007 365/148 |
| 2013/0044534 A1 | 2/2013 | Kawai et al. | |
| 2013/0242642 A1 | 9/2013 | Katayama et al. | |
| 2013/0339571 A1* | 12/2013 | Cernea | H01L 27/249 711/102 |

FOREIGN PATENT DOCUMENTS

| | | |
|---|---|---|
| JP | 2010-015662 | 1/2010 |
| WO | 2011/121970 | 10/2011 |
| WO | 2011/152061 | 12/2011 |
| WO | 2013/021649 | 2/2013 |

\* cited by examiner

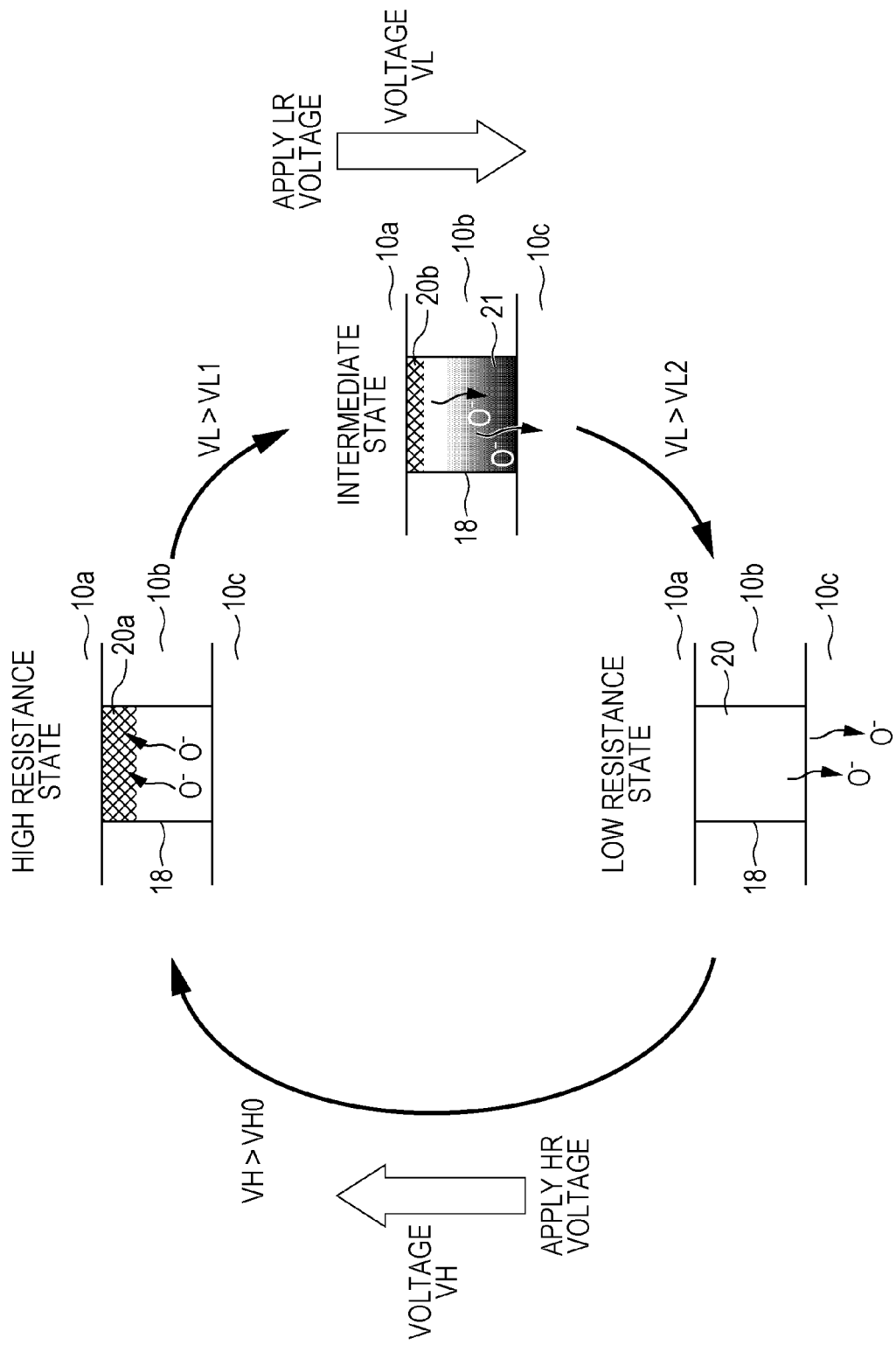

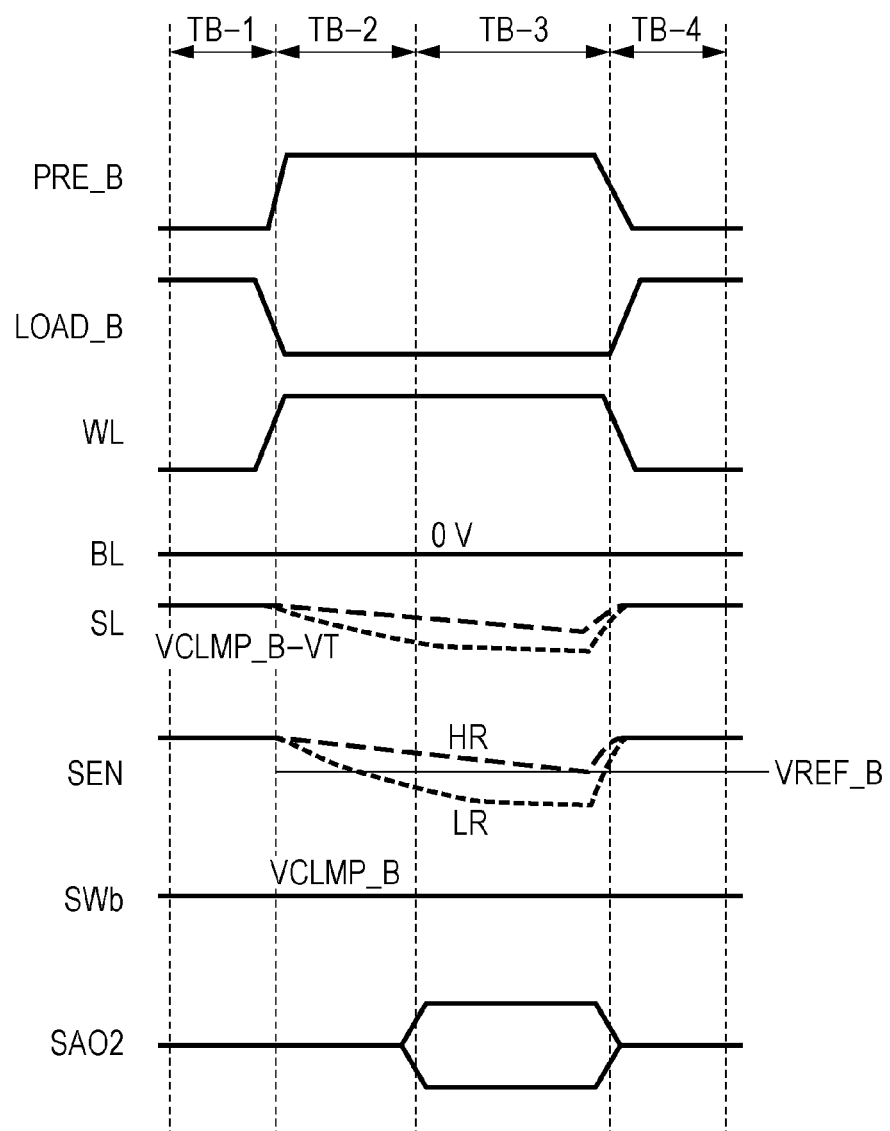

READ AND WRITE METHODS FOR A RESISTANCE CHANGE NON-VOLATILE MEMORY DEVICE

BACKGROUND

1. Technical Field

The present disclosure relates to a reading operation of a resistance-change nonvolatile memory device equipped with a resistance-change nonvolatile memory element as a memory cell, whose resistance value changes in accordance with an applied electrical signal.

2. Description of the Related Art

In recent years, resistance-change nonvolatile memory devices (which may sometimes be simply referred to as "nonvolatile memory devices" hereinafter) having memory cells constituted by using resistance-change nonvolatile memory elements (which may sometimes be simply referred to as "resistance change elements" hereinafter) have been researched and developed. A resistance change element has properties in which its resistance value changes reversibly in accordance with an electrical signal, and is also capable of storing data corresponding to this resistance value in a nonvolatile manner.

In a generally-known nonvolatile memory device that uses resistance change elements, so-called one-transistor one-resistor (1T1R) memory cells having metal-oxide semiconductor (MOS) transistors and resistance change elements connected in series to each other are disposed at positions near where bit lines and word lines arranged orthogonally to each other intersect, so as to be arrayed in a matrix. In each 1T1R memory cell, a resistance change element has two terminals, one of which is connected to a bit line or a source line while the other is connected to a drain terminal or a source terminal of a transistor. A gate terminal of the transistor is connected to a word line. Another terminal of the transistor is connected to the source line or the bit line not connected to the one terminal of the resistance change element. The source lines are arranged parallel to the bit lines or the word lines.

As memory cells that use resistance change elements, there is also a so-called cross-point structure in which memory cells are interposed between bit lines and word lines at positions where the bit lines and the word lines arranged orthogonally to each other intersect. Such a cross-point structure allows for stacking of memory cell arrays in the vertical direction, thereby achieving increased capacity.

Japanese Patent No. 4251576 discloses a nonvolatile semiconductor memory device for the purpose of suppressing an effect of read disturbance that causes the resistance value of a resistance change element to change due to a read voltage when performing a reading operation with respect to the resistance change element. This is achieved by applying a read voltage in a direction in which the read disturbance has a relatively low effect on the change during the reading operation.

SUMMARY

One non-limiting and exemplary embodiment provides a resistance-change nonvolatile memory device that allows for a stable reading operation.

In one general aspect, the techniques disclosed here feature a resistance-change nonvolatile memory device including a memory cell array having a plurality of memory cells arrayed in a matrix, a selection circuit that selects a memory cell from the memory cell array, and a read circuit for reading a resistance state of a resistance change element in the selected memory cell. In memory cells of odd-numbered-layer and even-numbered-layer memory cell arrays that constitute a multilayer memory cell array, each memory cell in any of the layers has a selection element, a first electrode, a first resistance change layer, a second resistance change layer, and a second electrode that are disposed in the same order. Whether the selected memory cell is located in any layer of the multilayer memory cell array, the read circuit applies a voltage to the selected memory cell to perform the reading operation, which causes the second electrode to become positive with reference to the first electrode in the selected memory cell.

The resistance-change nonvolatile memory device according to the present disclosure allows for a stable reading operation.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 5 illustrates a resistance changing mechanism of a filament in the resistance change element;

FIG. 19 is a timing chart showing the reading operation from the redundant-address-information region according to the second embodiment.

DETAILED DESCRIPTION OF THE EMBODIMENTS

Figure 1:
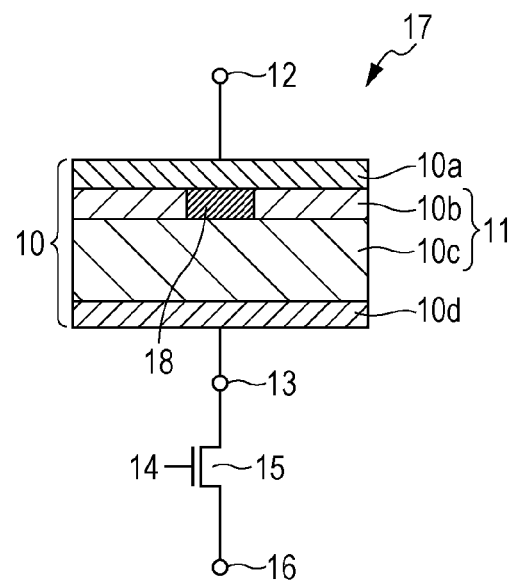
FIG. 1 illustrates the configuration of a 1T1R memory cell.

A resistance-change nonvolatile memory device according to an aspect of the present disclosure includes a memory cell array having a plurality of memory cells arrayed in a matrix, each of the plurality of memory cells including a resistance change element and a selection element connected in series to the resistance change element, the resistance change element including a first electrode, a second electrode, and a resistance change layer between the first electrode and the second electrode, a resistance value of the resistance change layer changing reversibly based on electrical signals of different polarities applied between the first electrode and the second electrode, the resistance change layer including a first resistance change layer in contact with the first electrode and a second resistance change layer in contact with the second electrode, the first resistance change layer including a first metal oxide having a first degree of oxygen deficiency, the second resistance change layer including a second metal oxide having a second degree of oxygen deficiency, the second degree of oxygen deficiency being lower than the first degree of oxygen deficiency of the first metal oxide; a selection circuit that selects a memory cell from the memory cell array; and a read circuit that reads a resistance state of the resistance change element included in the selected memory cell. The memory cell array comprises a multilayer memory cell array. In the multilayer cell array, an odd-numbered wiring layer includes a plurality of first wires being stacked on an even-numbered wiring layer including a plurality of second wires intersecting with the plurality of first wires. In the multilayer cell array, the plurality of the memory cells is provided at sections where the plurality of first wires included in the odd-numbered wiring layer intersect with the plurality of second wires included in the even-numbered wiring layer. The odd-numbered wiring layer and the even-numbered wiring layer are adjacent to each other in the stacking direction. The multilayer memory cell array includes an odd-numbered-layer memory cell array on the odd-numbered wiring layer and an even-numbered-layer memory cell array on the even-numbered wiring layer. Each memory cell in both of the odd-numbered-layer memory cell array and the even-numbered-layer memory cell array has the selection element, the first electrode, the first resistance change layer, the second resistance change layer, and the second electrode that are disposed in the same order. The read circuit includes a first sense amplifier and a second sense amplifier. The first sense amplifier reads the resistance state of each memory cell included in the odd-numbered-layer memory cell array. The second sense amplifier reads the resistance state of each memory cell included in the even-numbered-layer memory cell array. Irrespective of whether the selected memory cell is located in the odd-numbered-layer memory cell array or in the even-numbered-layer memory cell array, each of the first sense amplifier and the second sense amplifier applies to the selected memory cell a first voltage that causes the second electrode of the selected memory cell to become positive with reference to the first electrode of the selected memory cell.

According to this configuration, in a case where the memory cell array is a multilayer cross-point memory cell array, the reading operation is performed such that an increase of the resistance value of the resistance change element caused due to the characteristics of the resistance change element does not occur, whether the selected memory cell is located in any memory layer, whereby a stable operation can be achieved.

Furthermore, the resistance-change nonvolatile memory device may further include a write circuit that applies to the selected memory cell a second voltage that causes the second electrode of the selected memory cell to become positive with reference to the first electrode of the selected memory cell. When the write circuit sets the resistance change element included in the selected memory cell into a high resistance state, irrespective of whether the selected memory cell is located in the odd-numbered-layer memory cell array or in the even-numbered-layer memory cell array, whereby electric current flowing to the selected memory cell when increasing the resistance of the selected memory cell is in a direction from the second electrode of the selected memory cell toward the first electrode of the selected memory cell.

Furthermore, the resistance-change nonvolatile memory device may further include the write circuit applies to the selected memory cell a third voltage that causes the second electrode of the selected memory cell to become negative with reference to the first electrode of the selected memory cell. When the write circuit sets the resistance change element included in the selected memory cell into a low resistance state, irrespective of whether the selected memory cell is located in the odd-numbered-layer memory cell array or in the even-numbered-layer memory cell array, whereby electric current flowing to the selected memory cell when decreasing the resistance of the selected memory cell is in a direction from the first electrode of the selected memory cell toward the second electrode of the selected memory cell.

The first sense amplifier may be a charge-type sense amplifier circuit that detects a fourth voltage that increases at the odd-numbered wiring layer as a result of applying the first voltage to the selected memory cell. The second sense amplifier may be a discharge-type sense amplifier circuit that detects a fifth voltage that decreases at the odd-numbered wiring layer as a result of applying the first voltage to the selected memory cell.

Furthermore, the resistance change elements may have resistance change characteristic in which the resistance change element changes from a low resistance state to a high resistance state when a voltage higher than a positive voltage VH0 is applied to the second electrode with reference to the first electrode, the resistance change element changes from a high resistance state to a low resistance state when a voltage higher than a positive voltage VL2 is applied to the first electrode with reference to the second electrode, and a voltage region exists in which an upper limit for a positive voltage with reference to the second electrode is lower than or equal to the voltage VL2, and when the resistance change element is in a high resistance state and a voltage included in the voltage region is applied to the first electrode with reference to the second electrode, the resistance value further increases.

According to this configuration, an increase of the resistance value of the resistance change element caused due to the characteristics of the resistance change element does not occur in the reading operation. Therefore, for example, a problem such as the voltage required for a subsequent writing operation with respect to the selected memory cell becoming insufficient due to an increased resistance value is eliminated, whereby a resistance-change nonvolatile memory device that allows for a stable operation can be provided.

Furthermore, in order to perform the reading operation to the selected memory cell, the read circuit switches between an operation for applying a sixth voltage to the selected memory cell and an operation for applying a seventh voltage to the selected memory cell. The sixth voltage causes the second electrode to become positive with reference to the first electrode of the selected memory cell. The seventh voltage causes the first electrode to become positive with reference to the second electrode of the selected memory cell, in accordance with the number of times that the writing operation is to be performed on the selected memory cell.

According to this configuration, for example, when the writing operation is to be performed multiple times on the selected memory cell, the reading operation is performed such that an increase of the resistance value of the resistance change element caused due to the characteristics of the resistance change element does not occur. Therefore, for example, a problem such as the voltage required for a subsequent writing operation with respect to the selected memory cell becoming insufficient due to an increased resistance value is eliminated, whereby a stable operation can be achieved. Moreover, for example, when the writing operation is to be performed only once on the selected memory cell, the reading operation is performed such that the resistance value of the resistance change element is actively increased in accordance with the characteristics of the resistance change element, so that a read window as a resistance-state determination margin can be expanded, whereby a stable operation can be achieved.

Furthermore, when a voltage that is higher than a voltage VL1 and lower than or equal to a voltage VL2 but 0<VL1<VL2 is applied to the first electrode with reference to the second electrode, the resistance value of the resistance change element may increase with increasing applied voltage. When the read circuit applies the voltage that causes the first electrode to become positive with reference to the second electrode so as to perform the reading operation with respect to the selected memory cell, the read circuit may apply the voltage that is higher than the voltage VL1 and lower than or equal to the voltage VL2.

Furthermore, when a voltage that is higher than a voltage VL1 and is lower than or equal to a voltage VL3 but 0<VL1<VL3<VL2 is applied to the first electrode with reference to the second electrode, a value of electric current flowing to the resistance change element may increase with increasing applied voltage. When the read circuit applies the voltage that causes the first electrode to become positive with reference to the second electrode so as to perform the reading operation with respect to the selected memory cell, the read circuit may apply the voltage that is higher than the voltage VL1 and lower than or equal to the voltage VL3.

According to the above configuration, when the reading operation is to be performed such that the resistance value of the resistance change element is actively increased in accordance with the characteristics of the resistance change element, a voltage that causes the resistance value of the resistance change element to increase can be reliably applied.

Furthermore, the resistance change layer may comprise tantalum oxide or hafnium oxide. Furthermore, the first electrode may be composed of material or composition different from material or composition that the second electrode is composed of. A standard electrode potential V1 of the first electrode, a standard electrode potential V2 of the second electrode, and a standard electrode potential Vt of a transition metal oxide may satisfy Vt<V2, and V1<V2. The first electrode may be composed of a material selected from a group consisting of tungsten, nickel, tantalum, titanium, aluminum, a tantalum nitride, and a titanium nitride, and the second electrode may be composed of a material selected from a group consisting of platinum, iridium, and palladium. Furthermore, the selection element may be constituted of a diode.

Furthermore, a resistance-change nonvolatile memory device according to another aspect of the present disclosure includes a memory cell array having a plurality of memory cells arrayed in a matrix, each of the plurality of memory cells including a resistance change element and a selection element connected in series to the resistance change element, the resistance change element including a first electrode, a second electrode, and a resistance change layer between the first electrode and the second electrode, a resistance value of the resistance change layer changing reversibly based on electrical signals of different polarities applied between the first electrode and the second electrode; a selection circuit that selects a memory cell from the memory cell array; a write circuit that applies a write voltage to the selected memory cell; and a read circuit that performs a read operation for reading a resistance state of the resistance change element included in the selected memory cell, the read circuit having a sense amplifier circuit. In each memory cell of the memory cell array, the selection element has a first terminal, a second terminal, and a control terminal that controls conductivity and non-conductivity between the first terminal and the second terminal. One of the first electrode and the second electrode of the resistance change element is connected to one of the first terminal and the second terminal of the selection element, and the other one of the first electrode and the second electrode of the resistance change element and the other one of the first terminal and the second terminal of the selection element serve as opposite ends of the memory cell, The memory cell array is divided into a first memory area and a second memory area. A first wire is commonly connected to one end of a memory cell in the first memory area and one end of a memory cell in the second memory area. A second wire is commonly connected to the other end of the memory cell in the first memory area and the other end of the memory cell in the second memory area. When the reading operation is performed with respect to the memory cell selected in the first memory area, the selection circuit electrically connects the first wire to the sense amplifier circuit. When the reading operation is performed with respect to the memory cell selected in the second memory area, the selection circuit electrically connects the second wire to the sense amplifier circuit.

Furthermore, the number of times the writing operation is performed with respect to the memory cell selected in the first memory area may be larger than the number of times the writing operation is performed with respect to the memory cell selected in the second memory area.

Furthermore, the writing operation may be performed only one time with respect to the memory cell selected in the second memory area.

Furthermore, the memory cell selected in the first memory area may comprise a redundant memory cell that substitutes for a defective memory cell.

Furthermore, the memory cell selected in the second memory area may store address information indicating a position of the defective memory cell in the memory cell array.

According to this configuration, for example, in accordance with the number of times the writing operation is to be performed on the memory cell in the first memory area and the number of times the writing operation is to be performed on the memory cell in the second memory area, the reading operation is performed with respect to one of the memory cell in the first memory area and the memory cell in the second memory area on which the writing operation is to be performed the larger number of times, such that an increase of the resistance value of the resistance change element caused due to the characteristics of the resistance change element does not occur. Moreover, in accordance with the number of times the writing operation is to be performed on the memory cell in the first memory area and the number of times the writing operation is to be performed on the memory cell in the second memory area, the reading operation is performed with respect to the other one of the memory cell in the first memory area and the memory cell in the second memory area, which is not the aforementioned one that is to undergo the larger number of times of the writing operation, such that the resistance value of the resistance change element is actively increased in accordance with the characteristics of the resistance change element. Thus, a stable operation can achieved based on a method suitable for each of the memory cell in the first memory area and the memory cell in the second memory area.

According to this configuration, the resistance value of the resistance change element is actively increased in accordance with the characteristics of the resistance change element so that, for example, a read window as a resistance-state determination margin can be expanded by the increased resistance value, whereby a resistance-change nonvolatile memory device that allows for a stable operation can be provided.

These general and specific aspects may be implemented using a system, a method, and an integrated circuit, and any combination of systems, methods, and integrated circuits.

Embodiments of the present disclosure will be described below with reference to the drawings.

The embodiments to be described below indicate specific examples of the present disclosure. Numerical values, shapes, materials, components, positions and connection methods of components are examples and are not intended to limit the present disclosure. Furthermore, of the components in the following embodiments, components that are not defined in the independent claim indicating the broadest concept are described as arbitrary components.

New Knowledge Discovered by Present Inventors

First, with regard to a resistance change element, a phenomenon newly discovered by the present inventors and a problem in a resistance-change nonvolatile memory device will be described.

The present inventors have conducted an experiment on a resistance change element having a resistance change layer composed of an oxygen-deficient Ta oxide ($TaO_x$) and have obtained some knowledge to be described below.

FIG. 1 illustrates the configuration of a memory cell constituted of a resistance change element used in the experiment. A memory cell 17 is a one-transistor/one-resistor (1T1R) memory cell formed by connecting an NMOS transistor 15 and a resistance change element 10 in series. The NMOS transistor 15 is an example of a selection element.

The resistance change element 10 is formed by laminating a first electrode 10d composed of a tantalum nitride (TaN), a resistance change layer 11 formed by laminating a low-resistance first resistance change layer ($TaO_x$) 10c and a high-resistance second resistance change layer ($TaO_y$, x<y) 10b that are composed of an oxygen-deficient Ta oxide, and a second electrode 10a composed of iridium (Ir). Furthermore, the resistance change element 10 includes a third terminal 13 extending from the first electrode 10d, and a second terminal 12 extending from the second electrode 10a. An oxygen-deficient oxide is an oxide in which oxygen is deficient in terms of a stoichiometric composition.

The NMOS transistor 15, which is a selection transistor, includes a gate terminal 14, and one of source and drain terminals of the NMOS transistor 15 is connected in series to the third terminal 13 of the resistance change element 10. The other one of the source and drain terminals that is not connected to the third terminal of the resistance change element 10 extends out as a first terminal 16.

After manufacturing the memory cell 17, a forming process is performed by applying a predetermined voltage for a predetermined time to each of the first terminal 16, the second terminal 12, and the gate terminal 14, so that a local region 18 with a higher degree of oxygen deficiency than the second resistance change layer 10b is formed within the second resistance change layer 10b. In the local region 18, an electrically conductive path (also referred to as "filament") is formed as a result of an oxygen-deficient chain. By forming the local region 18 including the electrically conductive path, an operation for changing the resistance reversibly between a high resistance state and a low resistance state becomes possible.

Assuming that a standard electrode potential of the second electrode 10a is defined as V2, a standard electrode potential of the first electrode 10d is defined as V1, and a standard electrode potential of tantalum is defined as Vt, the resistance change element 10 is composed of a material with which the relationships among the standard electrode potentials satisfy Vt<V2 and V1<V2.

The memory cell 17 having the above-described configuration exhibits so-called bipolar characteristics in which, when a voltage higher than or equal to a predetermined positive voltage is applied to the first terminal 16 with reference to the second terminal 12, the resistance change element 10 transitions to the low resistance state, and when a voltage higher than or equal to a predetermined positive voltage is applied to the second terminal 12 with reference to the first terminal 16, the resistance change element 10 transitions to the high resistance state.

In the following description, a voltage to be applied in low-resistance writing in which the resistance change element 10 is set to the low resistance state will be expressed as an LR voltage, and the direction of applying this voltage will be expressed as an LR direction. A voltage to be applied in high-resistance writing in which the resistance change element 10 is set to the high resistance state will be expressed as an HR voltage, and the direction of applying this voltage will be expressed as an HR direction. The term "direction" in this case is equivalent to an electrical polarity.

Figure 2:
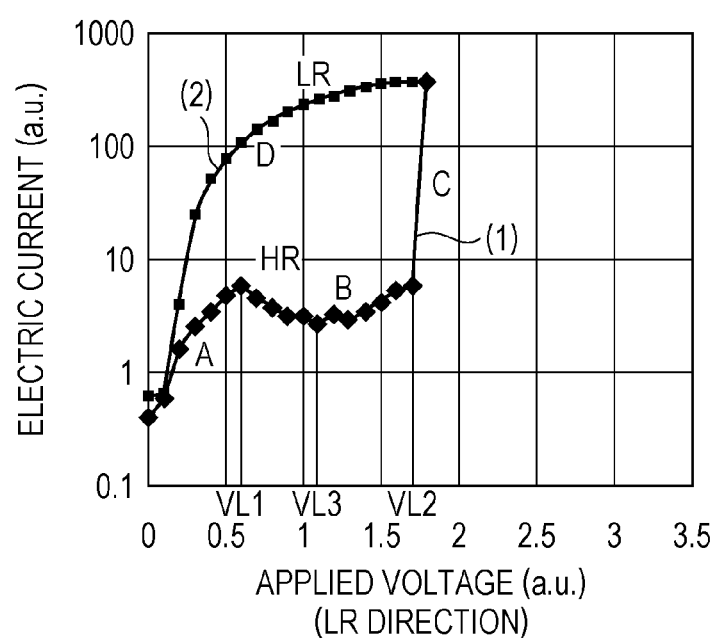
FIG. 2 is a current-voltage characteristic diagram of the 1T1R memory cell in a resistance decreasing direction.

FIG. 2 illustrates current-voltage characteristics (referred to as "I-V characteristics" hereinafter) obtained by measuring the electric current flowing from the first terminal 16 to the second terminal 12 when the voltage in the LR direction is applied to the memory cell 17 in FIG. 1 after performing the foaming process thereon. An operation for applying a gate voltage for turning on the NMOS transistor 15 to the gate terminal 14 of the NMOS transistor 15 and sequentially applying a positive voltage that increases in a stepwise manner to the first terminal 16 with reference to the second terminal 12 is repeated twice on the resistance change element 10 in the high resistance state. A trajectory (1) denoted by a thick line indicates the I-V characteristic measured in the first operation, and a trajectory (2) denoted by a narrow line indicates the I-V characteristic measured in the second operation.

Although not shown, when the operation is repeated three times or more, it is confirmed that an I-V characteristic identical to (2) is exhibited.

In the I-V characteristic corresponding to the first operation indicated by (1), the electric current exhibits a monotonically increasing characteristic (characteristic A) when a voltage of VL1 or lower is applied. When a voltage higher than VL1 and lower than or equal to VL2 is applied, the electric current exhibits a characteristic (characteristic B) in which it temporarily decreases and then increases again. When a voltage higher than VL2 is applied, the electric current exhibits a discontinuously increasing characteristic (characteristic C). The characteristic C corresponds to when there is a change in resistance from the high resistance state to the low resistance state.

In the I-V characteristic corresponding to the second operation indicated by (2), the electric current exhibits a characteristic (characteristic D) in which it monotonously increases in any region of the applied voltage, and when the voltage becomes higher than VL2, the electric current coincides with the electric current of the characteristic C having reached a low resistance state.

Figure 3:
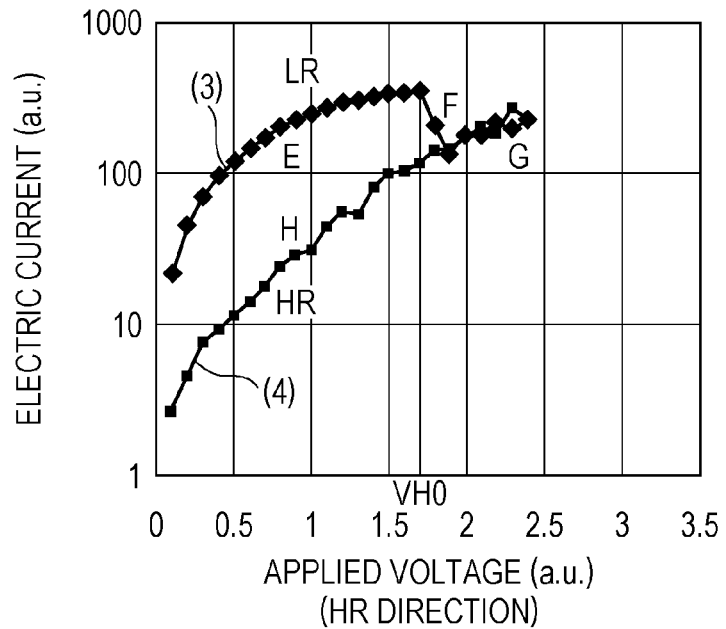
FIG. 3 is a current-voltage characteristic diagram of the 1T1R memory cell in a resistance increasing direction.

FIG. 3 illustrates voltage characteristics (referred to as "I-V characteristics" hereinafter) obtained by measuring the electric current flowing from the second terminal 12 to the first terminal 16 when a voltage in the HR direction, which is the opposite the above, is applied, continuing from (2). An operation for applying a gate voltage for turning on the NMOS transistor 15 to the gate terminal 14 of the NMOS transistor 15 and sequentially applying a positive voltage that increases in a stepwise manner to the second terminal 12 with reference to the first terminal 16 is repeated twice. A trajectory (3) denoted by a thick line indicates the I-V characteristic measured in the first operation, and a trajectory (4) denoted by a narrow line indicates the I-V characteristic measured in the second operation.

Although not shown, when the operation is repeated three times or more, it is confirmed that an I-V characteristic identical to (4) is exhibited.

In the I-V characteristic corresponding to the first operation indicated by (3), the electric current exhibits a monotonically increasing characteristic (characteristic E) when a voltage of VH0 or lower is applied. When a voltage higher than VH0 is applied, the electric current exhibits a discontinuously decreasing characteristic (characteristic F). The characteristic F corresponds to when there is a change in resistance from the low resistance state to the high resistance state. Subsequently, a monotonically increasing characteristic (characteristic G) is exhibited again.

In the I-V characteristic corresponding to the second operation indicated by (4), the electric current exhibits a characteristic (characteristic H) in which it substantially monotonously increases in any region of the applied voltage, and when the voltage becomes higher than VH0, the electric current substantially coincides with the electric current of the characteristic G.

Each of the I-V characteristics in FIGS. 2 and 3 is broadly comprehended as the following resistance change phenomenon in the related art.

The characteristic C in which the electric current discontinuously increases corresponds to a low-resistance operation point at which the high resistance state changes to the low resistance state, and the characteristic F in which the electric current discontinuously decreases corresponds to a high-resistance operation point at which the low resistance state changes to the high resistance state. The characteristic D and the characteristic E in which there is a relatively large flow of electric current each correspond to the low resistance state, whereas the characteristic A, the characteristic B, and the characteristic H in which the flow of electric current is smaller than in the characteristic D and the characteristic E each correspond to the high resistance state.

Furthermore, the characteristic D and the characteristic E corresponding to the low resistance state increase monotonously relative to the voltage even when the voltage-applied directions are different therebetween, and are symmetrical characteristics in which the amounts of electric current relative to the applied voltage are substantially identical.

In addition to the broad comprehension in the related art described above, the present inventors have further realized the existence of the following resistance change phenomenon based on FIGS. 2 and 3.

When a voltage VH in the HR direction is applied to the resistance change element 10 in the high resistance state, the electric current relative to the voltage VH increases monotonously in any voltage region (characteristic H).

On the other hand, when a voltage VL in the LR direction is applied to the resistance change element 10 in the high resistance state, the electric current relative to the voltage VL increases monotonously in a low voltage region higher than 0 and lower than or equal to VL1 (characteristic A). However, although the electric current decreases in a voltage region higher than VL1 and lower than or equal to VL3 and then starts increasing in a voltage region higher than VL3 and lower than or equal to VL2, the increasing rate is lower than the monotonously increasing rate in the low voltage region (characteristic B). The characteristic B expresses a resistance change phenomenon in which the resistance value of the resistance change element increases when the voltage VL in the LR direction and included in a specific voltage region (i.e., the region higher than VL1 and lower than or equal to VL2 in FIG. 2) is applied to the resistance change element in the high resistance state. In this specification, such a characteristic B that is unique to the resistance change element in the high resistance state will be referred to as "negative resistance characteristic".

The fact that the resistance change element 10 in the high resistance state has the negative resistance characteristic is not known in the related art and has been newly discovered by the present inventors.

Figure 4:
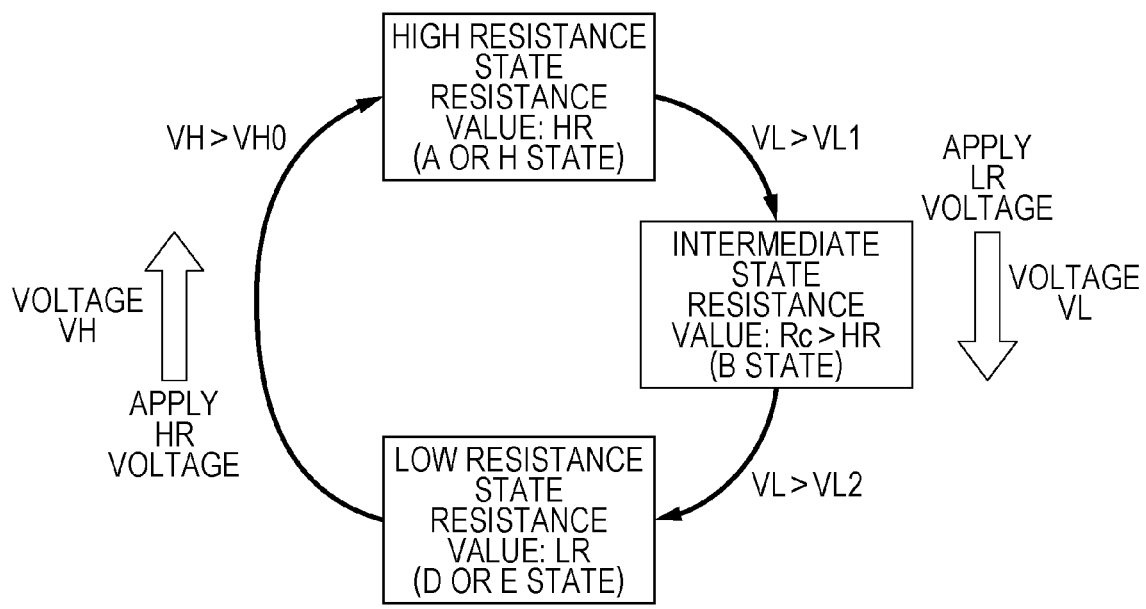
FIG. 4 illustrates the transition of a resistance state of a resistance change element.

FIG. 4 schematically illustrates the transition of the resistance state of the resistance change element 10 in the form of a state transition diagram.

The resistance change element 10 in a low resistance state having a resistance value LR (i.e., the state corresponding to the characteristic D or the state corresponding to the characteristic E) transitions to a high resistance state having a resistance value HR (i.e., the state corresponding to the characteristic A or the state corresponding to the characteristic H) by receiving a voltage VH in the HR direction that is higher than or equal to the predetermined voltage VH0.

The resistance change element 10 in the high resistance state having the resistance value HR (i.e., the state corresponding to the characteristic A or the state corresponding to the characteristic H) transitions to a high resistance state having a resistance value Rc higher than the resistance value HR by receiving a voltage VL in the LR direction that is higher than or equal to the predetermined voltage VL1 (i.e., the state corresponding to the characteristic B).

Then, when a voltage in the LR direction that is higher than or equal to the predetermined voltage VL2 is applied, a transition to the low resistance state having the resistance value LR (i.e., the state corresponding to the characteristic D or the state corresponding to the characteristic E) is made.

Accordingly, in a reversible change of the resistance change element between the high resistance state and the low resistance state, when an LR voltage VL (VL1<VL≤VL2) included in the specific voltage region is applied in a process for decreasing the resistance of the resistance change element in the high resistance state, the resistance value of the resistance change element further increases due to the aforementioned negative resistance characteristic.

This phenomenon can be conceived based on the following mechanism.

FIG. 5 illustrates a presumption mechanism showing the state of the filament 18 in FIG. 1 in correspondence with the state transition diagram illustrated in FIG. 4.

It is known in the related art that the resistance change phenomenon in the resistance change element 10 is an oxidation reduction phenomenon that occurs with the movement of oxygen ions within the filament 18 formed in the second resistance change layer 10b. Specifically, it is conceived that the high resistance state corresponds to when the resistance value of the filament 18 increases due to a high oxidation portion 20a formed by oxygen ions O⁻ in the first resistance change layer 10c moving to near the interface of the second electrode 10a set to a higher potential than the first electrode 10d.

It is conceived that the low resistance state corresponds to when the resistance value of the filament 18 decreases due to the voltage of the first electrode 10d being set to a higher potential than the second electrode 10a so as to cause the oxygen ions O⁻ to move from the high oxidation portion 20a to the first resistance change layer 10c.

When an LR voltage higher than VL1 is applied to the resistance change element 10 in the high resistance state, the oxygen ions in the high oxidation portion 20a formed at the second electrode 10a side begin to diffuse toward the first electrode 10d, in other words, reduction begins, so that the high oxidation portion 20a becomes reduced, as indicated by a high oxidation portion 20b. At the same time, the oxygen ion concentration within the filament 18 increases, and a high-concentration oxygen-ion-O⁻ retention portion 21 is formed near the interface with the filament 18 until the oxygen ions completely move to the first resistance change layer 10c.

As a result, it is presumed that the oxygen ions remain within the local region 18 at two locations, that is, a location near the interface with the second electrode 10a and a location near the interface with the first resistance change layer 10c, and that an intermediate state in which the resistance value of the resistance change element 10 is higher than that in the high resistance state is formed and appears as a negative resistance characteristic.

In a case where the LR voltage VL in the high resistance state having the resistance value HR is applied in a voltage region higher than VL1 and lower than or equal to VL2, a higher resistance state having the resistance value Rc higher than the original resistance value HR is maintained. When the resistance is to be decreased by applying the LR voltage VL again in this state, since the applied voltage is dividedly applied to, for example, the high oxidation portion 20a and the oxygen-ion-O⁻ retention portion 21, a drive voltage that is higher than the voltage VL2 becomes necessary.

The behavior having the intermediate state indicating the newly-discovered negative resistance characteristic described above may conceivably have the following effect on the operation of the resistance-change nonvolatile memory device and be utilized in the following manner.

First, in the high resistance state, the LR voltage is applied in a voltage region higher than VL1 and lower than or equal to VL2 so that the resistance value can be further increased. On the other hand, in the low resistance state, a change in the HR direction does not occur significantly (characteristic D in FIG. 2). Therefore, by applying a voltage higher than VL1 and lower than or equal to VL2 in the LR direction after a writing operation regardless of write data, a read window as a resistance-state determination margin between a memory cell set in the high resistance state and a memory cell set in the low resistance state can be expanded, whereby a more stable reading operation can be expected.

In the related art, as disclosed in Japanese Patent Application No. 2013-120253, in a memory cell using a resistance change element with bipolar characteristics, when an LR-direction voltage is applied to the memory cell in the high resistance state, it is conceived that the effect of a change in the LR direction (disturbance) may be readily received. Furthermore, in the memory cell using the resistance change element with bipolar characteristics in the related art, when an HR-direction voltage is applied to the memory cell in the low resistance state, it is conceived that the effect of a change in the HR direction (disturbance) may be readily received. Whether an LR-direction voltage is applied to the memory cell in the high resistance state or an HR-direction voltage is applied to the memory cell in the low resistance state, the effect of disturbance increases with increasing applied voltage. However, it is clear from the above description with reference to FIG. 3 that, in the knowledge newly discovered by the present inventors, the behavior in the high resistance state is different from that in the concept in the related art described above.

On the other hand, in view of this newly-discovered phenomenon, the following problem may also exist.

In order to suppress the aforementioned read disturbance in a reading operation of the resistance-change nonvolatile memory device, a voltage applied to one of the electrodes of the resistance change element is reduced to a low voltage of, for example, about 0.5 V relative to the other electrode, the electric current flowing to the opposite terminals of the memory cell is detected with a sense amplifier circuit, and the high resistance state or the low resistance state is determined as logical data "1" or "0".

In view of this phenomenon, when performing reading with respect to the memory cell in the high resistance state in the resistance-change nonvolatile memory device having a read circuit configured to perform reading based on a voltage in the LR direction, an effective voltage applied by the read circuit to the resistance change element may vary, or the voltage VL1 at which the intermediate state occurs may vary in the resistance change element itself. This may cause the voltage applied for the reading operation to enter the voltage region corresponding to this intermediate state, possibly causing the resistance of the resistance change element to further increase during the reading operation.

Although this is advantageous in that the read window can be expanded, as described above, if a writing operation for setting the memory cell to the low resistance state is to be performed in a subsequent operation cycle and thereafter, there is conceivably a problem in that the memory cell cannot be set to the low resistance state unless a voltage higher than the original LR voltage VL2 is applied.

Furthermore, the foaming process performed in the manufacturing process involves using the read circuit to detect a slight increase in electric current flowing through the memory cell so as to determine whether or not the electrically conductive path 18 has been formed as a result of applying a predetermined foaming voltage to the resistance change element in a super high resistance state after the manufacturing process. In this case, when the read determination is performed based on the voltage in the LR direction, the reading operation itself may cause the resistance change element to change in the HR direction, which may conceivably be a problem in that accurate foaming determination cannot be performed.

Accordingly, if the number of times a writing operation is to be performed (e.g., once or several times) is limited or when a sufficiently high write voltage can be applied, the reading operation is performed by applying a voltage higher than VL1 and lower than or equal to VL2 in the LR direction, so that the read window can be expanded by actively utilizing the negative resistance characteristic, whereby a resistance-change nonvolatile memory device that allows for a stable reading operation can be achieved.

If the required number of times a writing operation is to be performed is large, if the writing operation needs to be performed with a lower voltage, or when it is necessary to perform read determination with minimal memory-cell electric current, the reading operation is performed by applying a voltage in the HR direction so that an increase in the resistance value of the resistance change element due to the negative resistance characteristic is prevented in the reading operation, whereby a satisfactory resistance-change nonvolatile memory device can be achieved.

In view of the presumption mechanism of the negative resistance characteristic described above, the negative resistance characteristic is conceived to be a characteristic that the resistance change element normally has, whose resistance changes based on an oxidation-reduction reaction in the filament. Therefore, the present disclosure is not limitedly applied to the resistance change element used in the experiment performed by the present inventors and may be widely applied to a resistance change element having the following configuration.

In a resistance change element to which an aspect of the present disclosure is applicable, a resistance change layer is a layer that is interposed between a first electrode and a second electrode and whose resistance value reversibly changes based on an electrical signal applied between the first electrode and the second electrode. For example, the resistance change layer reversibly transitions between a high resistance state and a low resistance state in accordance with the polarity of voltage applied between the first electrode and the second electrode. The resistance change layer is formed by laminating at least two layers, namely, a first resistance change layer connected to the first electrode and a second resistance change layer connected to the second electrode.

The first resistance change layer is composed of an oxygen-deficient first metal oxide, and the second resistance change layer is composed of a second metal oxide with a lower degree of oxygen deficiency than the first metal oxide. In the second resistance change layer of the resistance change element, a micro local region is formed in which the degree of oxygen deficiency changes reversibly in accordance with application of an electrical pulse. The local region is conceived to include a filament constituted of an oxygen deficient site.

The degree of oxygen deficiency refers to the percentage of deficient oxygen relative to the amount of oxygen constituting an oxide in a stoichiometric composition (i.e., a stoichiometric composition with the highest resistance value if a plurality of stoichiometric compositions exist) of a metal oxide. The metal oxide of the stoichiometric composition is more stable and has a higher resistance value than metal oxides of other compositions.

For example, in a case where the metal is tantalum (Ta), since the oxide of the stoichiometric composition based on the above definition is $Ta_2O_5$, the oxide can be expressed as $TaO_{2.5}$. The degree of oxygen deficiency of $TaO_{2.5}$ is 0%, whereas the degree of oxygen deficiency of $TaO_{1.5}$ is 40% (=(2.5−1.5)/2.5. The degree of oxygen deficiency of an oxygen-excessive metal oxide is a negative value. In this specification, the degree of oxygen deficiency is described as including a positive value, zero, and a negative value, unless otherwise noted.

An oxide with a low degree of oxygen deficiency has a high resistance value since it is more similar to the oxide of the stoichiometric composition. An oxide with a high degree of oxygen deficiency has a low resistance value since it is more similar to the metal constituting the oxide.

An oxygen content percentage is the ratio of oxygen atoms to the total number of atoms. For example, the oxygen content percentage of $Ta_2O_5$ is the ratio (O/(Ta+O)) of oxygen atoms to the total number of atoms and is equal to 71.4 atm %. Therefore, the oxygen content percentage of an oxygen-deficient tantalum oxide is higher than zero and lower than 71.4 atm %. For example, if the metal constituting the first metal oxide and the metal constituting the second metal oxide are of the same kind, the oxygen content percentage has a correspondence relationship with the degree of oxygen deficiency. In other words, when the oxygen content percentage of the second metal oxide is higher than the oxygen content percentage of the first metal oxide, the degree of oxygen deficiency of the second metal oxide is lower than the degree of oxygen deficiency of the first metal oxide.

The resistance change layer may be composed of tantalum or a metal other than tantalum. The metal constituting the resistance change layer may be a transition metal or aluminum (Al). Examples of a transition metal include tantalum (Ta), titanium (Ti), hafnium (Hf), zirconium (Zr), niobium (Nb), tungsten (W), and nickel (Ni). Since a transition metal can be in a plurality of oxidation states, different resistance states can be achieved by an oxidation-reduction reaction.

For example, in a case where a tantalum oxide is used as the resistance change layer, if x ranges between 0.8 and 1.9 when the composition of the first metal oxide layer is defined as $TaO_x$, and y is a value larger than x when the composition of the second metal oxide layer is defined as $TaO_y$, the resistance value of the resistance change layer can be stably changed at high speed. In this case, the thickness of the second metal oxide layer may range between 1 nm and 8 nm.

For example, in a case where a hafnium oxide is used as the resistance change layer, if x ranges between 0.9 and 1.6 when the composition of the first metal oxide layer is defined as $HfO_x$, and y is a value larger than x when the composition of the second metal oxide layer is defined as $HfO_y$, the resistance value of the resistance change layer can be stably changed at high speed. In this case, the thickness of the second metal oxide layer may range between 3 nm and 4 nm.

In a case where a zirconium oxide is used as the resistance change layer, if x ranges between 0.9 and 1.4 when the composition of the first metal oxide layer is defined as $ZrO_x$, and y is a value larger than x when the composition of the second metal oxide layer is defined as $ZrO_y$, the resistance value of the resistance change layer can be stably changed at high speed. In this case, the thickness of the second metal oxide layer may range between 1 nm and 5 nm.

A first metal constituting the first metal oxide used as the first resistance change layer and a second metal constituting the second metal oxide used as the second resistance change layer may be different kinds of metals. In this case, the second metal oxide may have a degree of oxygen deficiency lower than that of the first metal oxide. In other words, the resistance of the second metal oxide may be higher than that of the first metal oxide. With this configuration, when a voltage is applied between the first electrode and the second electrode for changing the resistance, a larger amount of the voltage is distributed to the second metal oxide, so that an oxidation-reduction reaction can be made to occur more readily in the second metal oxide.

If different materials are used for the first metal constituting the first metal oxide and the second metal constituting the second metal oxide, the standard electrode potential of the second metal may be lower than the standard electrode potential of the first metal. A standard electrode potential indicates characteristics in which oxidation is less likely to occur as the value thereof increases. Thus, in the second metal oxide whose standard electrode potential is relatively low, an oxidation-reduction reaction occurs more readily. In a resistance change phenomenon, it is conceived that the filament (i.e., the electrically conductive path) changes due to an oxidation-reduction reaction occurring in the micro local region formed in the second metal oxide with high resistance so that the resistance value (i.e., the degree of oxygen deficiency) thereof changes.

For example, by using an oxygen-deficient tantalum oxide ($TaO_x$) as the first metal oxide and a titanium oxide ($TiO_2$) as the second metal oxide, a stable resistance changing operation is achieved. Titanium (standard electrode potential=−1.63 eV) is a material with a standard electrode potential lower than that of tantalum (standard electrode potential=−0.6 eV). Accordingly, by using a metal oxide with a standard electrode potential lower than that of the first metal oxide as the second metal oxide, an oxidation-reduction reaction is made to occur more readily in the second metal oxide. As other combinations, an aluminum oxide ($Al_2O_3$) may be used as the second metal oxide serving as the high resistance layer. For example, an oxygen-deficient tantalum oxide ($TaO_x$) may be used as the first metal oxide, and an aluminum oxide ($Al_2O_3$) may be used as the second metal oxide.

In the resistance change phenomenon in the multilayer-structured resistance change layer, it is conceived that the filament (i.e., the electrically conductive path) in the micro local region formed in the high-resistance second metal oxide changes due to an oxidation-reduction reaction occurring in the local region when the resistance increases and also when the resistance decreases, so that the resistance value thereof changes.

In other words, when a positive voltage is applied to the second electrode, which is connected to the second metal oxide layer, with reference to the first electrode, the oxygen ions in the resistance change layer are drawn toward the second metal oxide layer. Thus, an oxidation reaction occurs in the micro local region formed in the second metal oxide layer, so that the degree of oxygen deficiency decreases. As a result, it is conceived that the resistance value increases due to reduced connectability of the filament in the local region.

In contrast, when a negative voltage is applied to the second electrode, which is connected to the second metal oxide layer, with reference to the first electrode, the oxygen ions in the second metal oxide layer are forced to move toward the first metal oxide. Thus, a reduction reaction occurs in the micro local region formed in the second metal oxide layer, so that the degree of oxygen deficiency increases. As a result, it is conceived that the resistance value decreases due to increased connectability of the filament in the local region.

The second electrode connected to the second metal oxide layer with the lower degree of oxygen deficiency is composed of a material, such as platinum (Pt), iridium (Ir), or palladium (Pd), with a standard electrode potential higher than those of the metal constituting the second metal oxide and the material constituting the first electrode. The first electrode connected to the first metal oxide layer with the higher degree of oxygen deficiency may be composed of a material, such as tungsten (W), nickel (Ni), tantalum (Ta), titanium (Ti), aluminum (Al), a tantalum nitride (TaN), or a titanium nitride (TiN), with a standard electrode potential lower than that of the metal constituting the first metal oxide. A standard electrode potential indicates characteristics in which oxidation is less likely to occur as the value thereof increases.

Specifically, a standard electrode potential V2 of the second electrode, a standard electrode potential Vr2 of the metal constituting the second metal oxide, a standard electrode potential Vr1 of the metal constituting the first metal oxide, and a standard electrode potential V1 of the first electrode may satisfy the relationships Vr2<V2 and V1<V2. Moreover, the relationship Vr1≥V1 may be satisfied when V2>Vr2.

With the above-described configuration, an oxidation-reduction reaction is made to occur selectively in the second metal oxide near the interface between the second electrode and the second metal oxide, so that a stable resistance change phenomenon is obtained.

First Embodiment

Structure of Cross-Point Memory Cell

A first embodiment relates to a resistance-change nonvolatile memory device that includes a cross-point memory cell array. A cross-point memory cell array is a memory cell array in which memory cells are arranged at positions where word lines and bit lines intersect. The configuration and operation of this nonvolatile memory device will be described below.

Figure 6A:
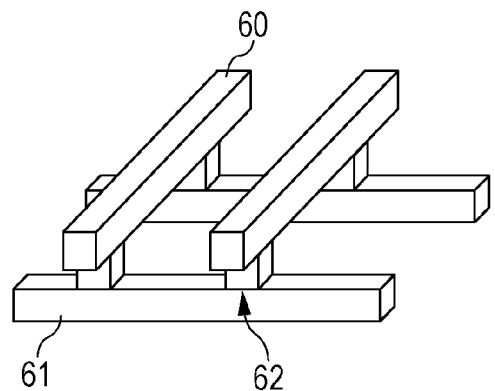
FIG. 6A illustrates a three-dimensional structure of a single-layer cross-point memory cell array.

FIG. 6A illustrates a three-dimensional structure of a single-layer cross-point memory cell array. Bit lines 61 are arranged as a first wiring layer, and word lines 60 are arranged as a second wiring layer above the first wiring layer so as to intersect with the bit lines 61. Memory cells 62 are provided at positions where the bit lines 61 and the word lines 60 intersect.

Figure 6B:
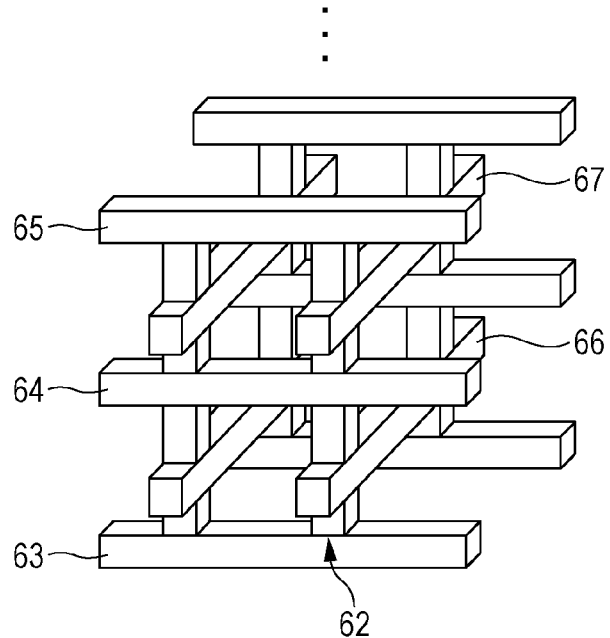
FIG. 6B illustrates a three-dimensional structure of a multilayer cross-point memory cell array.

FIG. 6B illustrates a three-dimensional structure of a multilayer cross-point memory cell array. First-layer bit lines 63 are arranged as a first wiring layer, and first-layer word lines 66 are arranged as a second wiring layer above the first wiring layer so as to intersect with the first-layer bit lines 63. Furthermore, second-layer bit lines 64 are arranged as a third wiring layer above the second wiring layer so as to intersect with the first-layer word lines 66. Moreover, second-layer word lines 67 are arranged as a fourth wiring layer above the third wiring layer so as to intersect with the second-layer bit lines 64. Furthermore, third-layer bit lines 65 are arranged as a fifth wiring layer above the fourth wiring layer so as to intersect with the second-layer word lines 67. Memory cells 62 are provided at sections where the word lines and the bit lines intersect. Accordingly, a cross-point memory cell array is characterized in that it can be formed into a multilayer configuration so that the degree of integration thereof can be increased.

In FIGS. 6A and 6B, the first wiring layer, the third wiring layer, and the fifth wiring layer are examples of odd-numbered wiring layers, whereas the second wiring layer and the fourth wiring layer are examples of even-numbered wiring layers. The bit lines are an example of first wires, whereas the word lines are an example of second wires.

Figure 7:
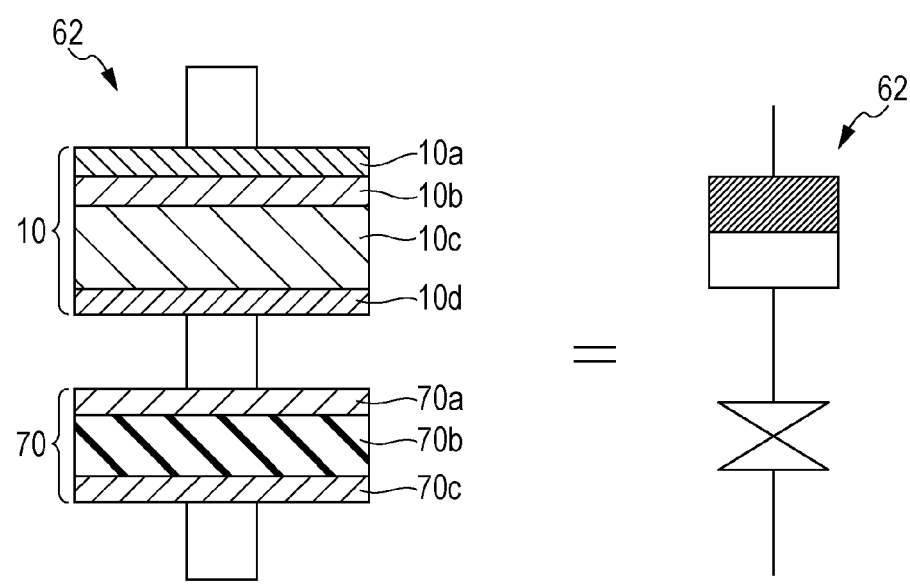
FIG. 7 is a cross-sectional view and an equivalent circuit diagram of a memory cell.

Next, FIG. 7 is a cross-sectional view illustrating the configuration of each memory cell 62 used in the cross-point memory cell array. The memory cell 62 has a resistance change element 10 and a current control element 70 and is of a so-called one-diode/one-resistor (1D1R) type in which the current control element 70 is connected in series to a first electrode (in this case, a lower electrode) 10d of the resistance change element 10. The current control element 70 is an example of a selection element.

Since the resistance change element 10 is identical to the resistance change element 10 described with reference to FIG. 1, a description thereof will be omitted here.

The current control element 70 is a diode element having a current-voltage characteristic that is nonlinear in both positive and negative directions of the applied voltage. This current control element 70 has a structure in which a current control layer 70b composed of a nitrogen-deficient silicon nitride ($SiN_x$) is interposed between a lower electrode 70c and an upper electrode 70a that are composed of, for example, a tantalum nitride (TaN).

The expression "current-voltage characteristic that is nonlinear in both directions" means that the current control element 70 is in a high resistance (off) state in a predetermined voltage range and is in a low resistance (on) state in regions where the voltage is higher than and lower than the predetermined voltage range. In other words, the current control element 70 is in the high resistance (off) state when an absolute value of the applied voltage is smaller than or equal to a predetermined value, and is in the low resistance (on) state when the absolute value is larger than the predetermined value.

In the following description, each memory cell 62 is expressed as an equivalent circuit shown in FIG. 7 in each circuit diagram.

Configuration of Resistance-Change Nonvolatile Memory Device

Figure 8:
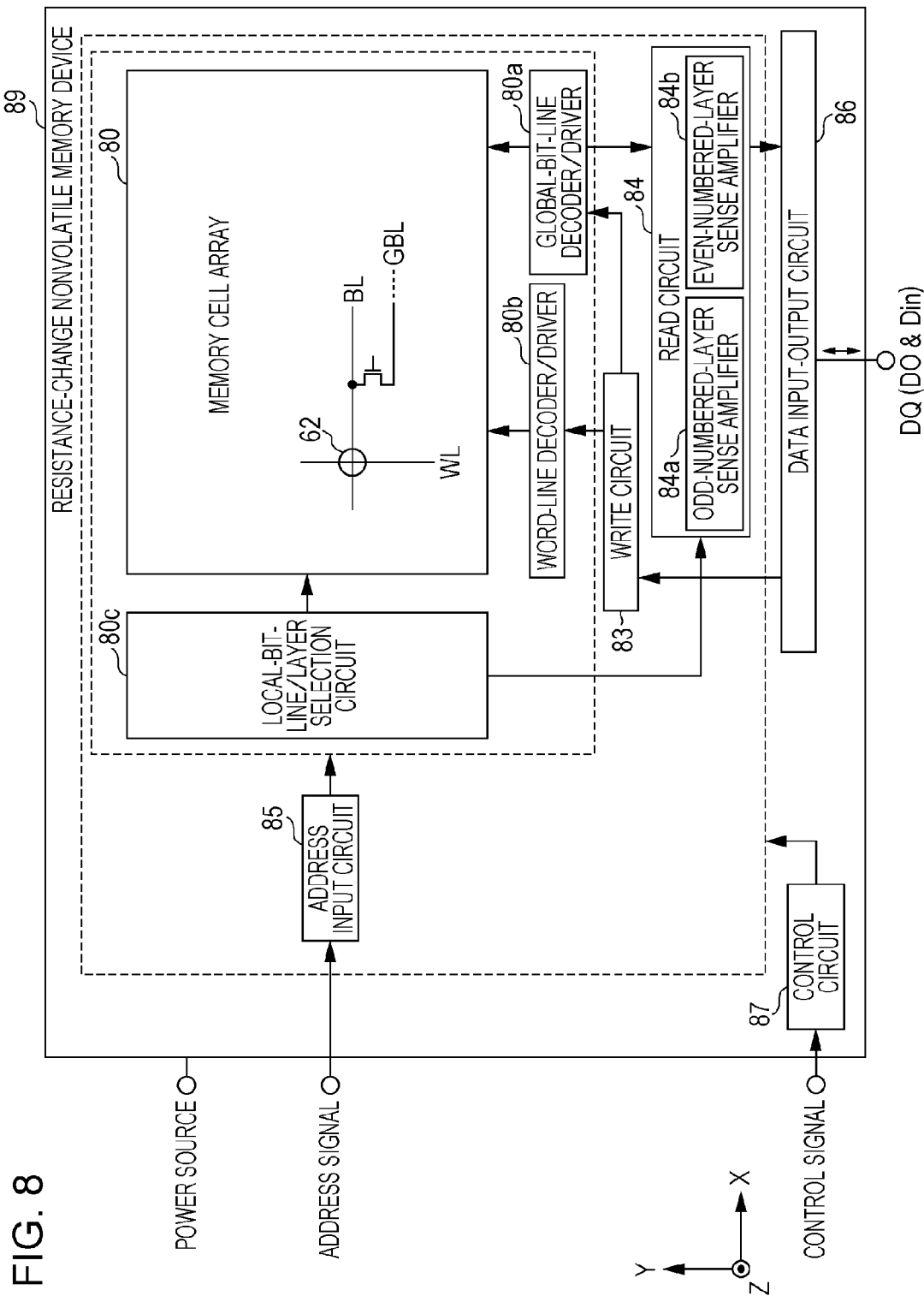
FIG. 8 illustrates the configuration of a resistance-change nonvolatile memory device according to a first embodiment.

FIG. 8 illustrates the configuration of the resistance-change nonvolatile memory device according to the first embodiment. A memory cell array of a resistance-change nonvolatile memory device 89 according to the first embodiment is constituted of cross-point memory cells.

The resistance-change nonvolatile memory device 89 includes a memory cell array 80 having a configuration in which local bit lines BL and global bit lines GBL are wired in an X direction, word lines WL are wired in a Y direction, and the memory cells 62 are disposed at sections where the local bit lines BL and the word lines WL intersect. Furthermore, in order to select a predetermined memory cell from the plurality of memory cells 62, the resistance-change nonvolatile memory device 89 includes a global-bit-line decoder/driver 80a for selecting one global bit line GBL from the plurality of global bit lines GBL and applying a predetermined voltage thereto in each operation, and a word-line decoder/driver 80b for selecting one word line WL from the plurality of word lines WL and applying a predetermined voltage thereto in accordance with each operation. Moreover, the resistance-change nonvolatile memory device 89 includes a local-bit-line/layer selection circuit 80c that selects one local bit line BL from the plurality of local bit lines BL. The resistance-change nonvolatile memory device 89 further includes a write circuit 83 that writes data, and a read circuit 84 that detects an amount of electric current flowing through the selected memory cell so as to determine whether the memory cell is in the high resistance state or the low resistance state. Furthermore, the resistance-change nonvolatile memory device 89 includes a data input-output circuit 86 that performs an input-output process of input-output data, an address input circuit 85 that receives an address signal input from the outside, and a control circuit 87 that controls the operation of the memory cell array 80 based on a control signal input from the outside.

Furthermore, the read circuit 84 includes two sense amplifiers, namely, an odd-numbered-layer sense amplifier 84a and an even-numbered-layer sense amplifier 84b that operate based on different methods.

Each of the global-bit-line decoder/driver 80a, the word-line decoder/driver 80b, and the local-bit-line/layer selection circuit 80c is an example of a selection circuit that selects an arbitrary memory cell as a selected memory cell from the memory cell array 80.

The memory cell array 80 is formed by arranging a plurality of memory cells 62 in a row direction and a column direction in an arrayed manner and stacking two layers of memory cell arrays.

Figure 9:
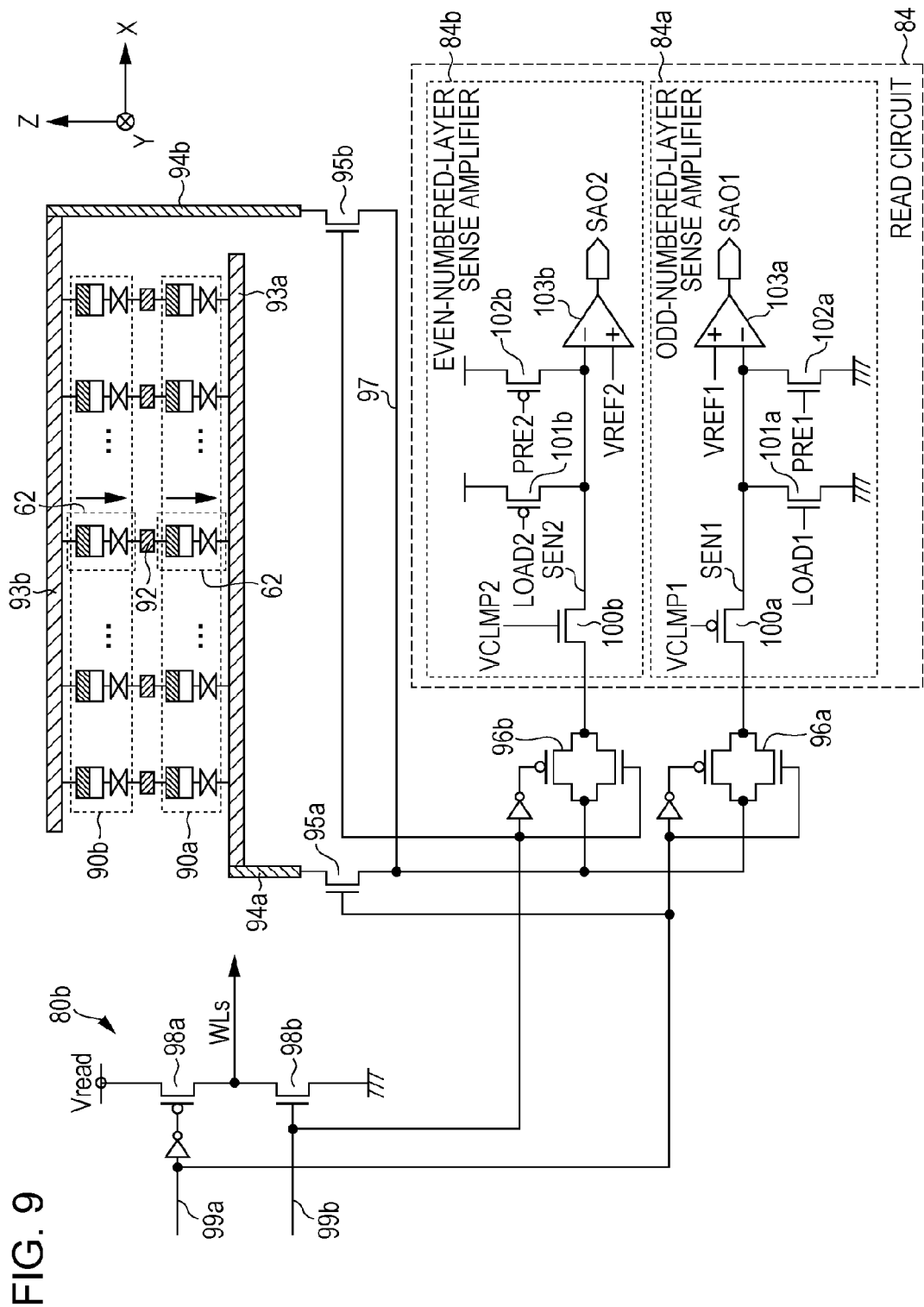
FIG. 9 is a cross-sectional view illustrating the structure of a two-layer cross-point memory cell array according to the first embodiment.

FIG. 9 is a cross-sectional view illustrating the structure of a two-layer cross-point memory cell array according to the first embodiment. Specifically, FIG. 9 illustrates the relationship between the cross-sectional structure of the memory cell array 80 as viewed from the Y direction (i.e., the longitudinal direction of the word lines) and the configuration of a sense amplifier circuit connected thereto via a global bit line 97.

The memory cells 62 in the first layer are disposed at sections where first-layer local bit lines 93a wired in the X direction and word lines 92 wired in the Y direction intersect, and these plurality of memory cells 62 constitute a first-layer memory cell group 90a. Each memory cell 62 has a structure in which the current control element 70 is disposed at the first-layer local bit line 93a side and the resistance change element 10 is disposed at the word line 92 side. Each first-layer local bit line 93a is connected to one end of an odd-numbered-layer switch element 95a via an odd-numbered-layer local via 94a, and the other end of the odd-numbered-layer switch element 95a is connected to the global bit line 97.

The memory cells 62 in the second layer are disposed at sections where second-layer local bit lines 93b wired in the X direction and the word lines 92 wired in the Y direction intersect, and these plurality of memory cells 62 constitute a second-layer memory cell group 90b. Each memory cell 62 has a structure in which the resistance change element 10 is disposed at the second-layer local bit line 93b side and the current control element 70 is disposed at the word line 92 side. Each second-layer local bit line 93b is connected to one end of an even-numbered-layer switch element 95b via an even-numbered-layer local via 94b, and the other end of the even-numbered-layer switch element 95b is connected to the global bit line 97.

The first-layer local bit lines 93a and the second-layer local bit lines 93b are examples of first wires, whereas the word lines 92 are an example of second wires that intersect with the first wires.

The memory cells in the first layer and the memory cells in the second layer are oriented in the same direction with respect to the Z direction. For example, each of the memory cells in the first and second layers is formed by laminating the layers included in the cross-sectional structure in FIG. 7 in the order shown in FIG. 7.

In the configuration example in FIG. 7, the resistance change element 10 has a configuration in which the low-resistance first resistance change layer 10c and the high-resistance second resistance change layer 10b are interposed between the first electrode 10d and the second electrode 10a.

With regard to the memory cells in the first and second layers, the reason why the layers constituting each memory cell are laminated in the same order in this manner is as follows. Regardless of which layer memory cells are disposed in, identical laminate bodies are disposed by performing the same manufacturing process for both the first and second layers so that memory cells having uniform characteristics can be readily obtained.

The global bit line 97 is connected to an odd-numbered-layer selection switch element 96a operating based on an odd-numbered-layer selection signal 99a as a control signal and also to an even-numbered-layer selection switch element 96b operating based on an even-numbered-layer selection signal 99b as a control signal. The odd-numbered-layer selection switch element 96a is connected to the odd-numbered-layer sense amplifier 84a, and the even-numbered-layer selection switch element 96b is connected to the even-numbered-layer sense amplifier 84b.

The odd-numbered-layer sense amplifier 84a has the following configuration. The odd-numbered-layer sense amplifier 84a includes an odd-numbered-layer p-channel metal-oxide semiconductor (PMOS) clamp transistor 100a having one end connected to the odd-numbered-layer selection switch element 96a, another end connected to a node SEN1, and a gate terminal connected to a control voltage VCLMP1. The odd-numbered-layer sense amplifier 84a also includes an odd-numbered-layer n-channel metal-oxide semiconductor (NMOS) load transistor 101a having one end connected to the node SEN1, another end connected to ground GND, and a gate terminal connected to a control signal LOAD1. Furthermore, the odd-numbered-layer sense amplifier 84a includes an odd-numbered-layer NMOS pre-charge transistor 102a having one end connected to the node SEN1, another end connected to the ground GND, and a gate terminal connected to a control signal PRE1. Moreover, the odd-numbered-layer sense amplifier 84a includes an odd-numbered-layer comparator 103a whose one end is connected to the node SEN1 and another end is supplied with a reference voltage VREF1. The odd-numbered-layer comparator 103a compares the electric potential of the node SEN1 with the reference voltage VREF1 and outputs VDN or GND to an output terminal SAO1 in accordance with the magnitude relationship therebetween.

The even-numbered-layer sense amplifier 84b has the following configuration. The even-numbered-layer sense amplifier 84b includes an even-numbered-layer NMOS clamp transistor 100b having one end connected to the even-numbered-layer selection switch element 96b, another end connected to the node SEN2, and a gate terminal connected to a control voltage VCLMP2. The even-numbered-layer sense amplifier 84b also includes an even-numbered-layer PMOS load transistor 101b having one end connected to the node SEN2, another end connected to a power source VDD, and a gate terminal connected to a control signal LOAD2. Furthermore, the even-numbered-layer sense amplifier 84b includes an even-numbered-layer PMOS pre-charge transistor 102b having one end connected to the node SEN2, another end connected to the power source VDD, and a gate terminal connected to a control signal PRE2. Moreover, the even-numbered-layer sense amplifier 84b includes an even-numbered-layer comparator 103b whose one end is connected to the node SEN2 and another end is supplied with a reference voltage VREF2. The even-numbered-layer comparator 103b compares the electric potential of the node SEN2 with the reference voltage VREF2 and outputs VDD or GND to an output terminal SAO2 in accordance with the magnitude relationship therebetween.

Furthermore, in this structure, an LR direction for the first-layer memory cell group 90a corresponds to a direction for increasing the electric potential of the global bit line 97 with reference to the word lines 92, whereas an LR direction for the second-layer memory cell group 90b corresponds to a direction for increasing the electric potential of the word lines 92 with reference to the global bit line 97. In other words, a direction in which electric current flows to each memory cell in the first-layer memory cell group 90a when decreasing the resistance is the same as a direction in which electric current flows to each memory cell in the second-layer memory cell group 90b when decreasing the resistance. In the resistance change element 10 (see FIG. 1) of each memory cell, electric current flows from the first electrode (i.e., the lower electrode) toward the second electrode (i.e., the upper electrode).

Therefore, an HR direction for the first-layer memory cell group 90a corresponds to a direction for decreasing the electric potential of the global bit line 97 relative to the word lines 92, whereas an HR direction for the second-layer memory cell group 90b corresponds to a direction for decreasing the electric potential of the word lines 92 with reference to the global bit line 97. In other words, a direction in which electric current flows to each memory cell in the first-layer memory cell group 90a when increasing the resistance is the same as a direction in which electric current flows to each memory cell in the second-layer memory cell group 90b when increasing the resistance. In the resistance change element 10 (see FIG. 1) of each memory cell, electric current flows from the second electrode (i.e., the upper electrode) toward the first electrode (i.e., the lower electrode).

In the above description, the layer corresponding to the first-layer memory cell group 90a corresponds to an even-numbered memory layer, and the layer corresponding to the second-layer memory cell group 90b corresponds to an even-numbered memory layer.

As described with reference to FIG. 6B, in a case where memory cell groups are stacked in three or more layers, when the memory cells are further stacked in the Z direction, the third layer, the fifth layer, and so on are odd-numbered memory layers, whereas the second layer, the fourth layer, and so on are even-numbered memory layers. In this case, memory cell groups 90a in the odd-numbered memory layers and memory cell groups 90b in the even-numbered memory layers are sequentially stacked in the Z direction based on the connection relationship shown in FIG. 9. Specifically, odd-numbered-layer local bit lines connected to the memory cell groups in the odd-numbered layers are commonly connected to the odd-numbered-layer local via 94a, and are further connected to the global bit line 97 via the odd-numbered-layer switch element 95a. Furthermore, even-numbered-layer local bit lines connected to the memory cell groups in the even-numbered layers are commonly connected to the even-numbered-layer local via 94b, and are further connected to the global bit line 97 via the even-numbered-layer switch element 95b.

Such a multilayer configuration having three or more layers is similar to the two layers of memory cell groups described above in that the direction in which electric current flows to the memory cells in each odd-numbered-layer memory cell group when decreasing the resistance is the same as the direction in which electric current flows to the memory cells in each even-numbered-layer memory cell group when decreasing the resistance. Furthermore, the direction in which electric current flows to the memory cells in each odd-numbered-layer memory cell group when increasing the resistance is the same as the direction in which electric current flows through the memory cells in each even-numbered-layer memory cell group when increasing the resistance.

Operation of Resistance-Change Nonvolatile Memory Device

With regard to the resistance-change nonvolatile memory device 89 having the above-described configuration, the operation in a reading cycle when reading data from a selected memory cell in one of the odd-numbered and even-numbered memory layers will be described with reference to the circuit configuration diagram in FIG. 9 and timing charts shown in FIGS. 10 and 11.

When Memory Cell in Odd-Numbered Memory Layer is Selected

Figure 10:
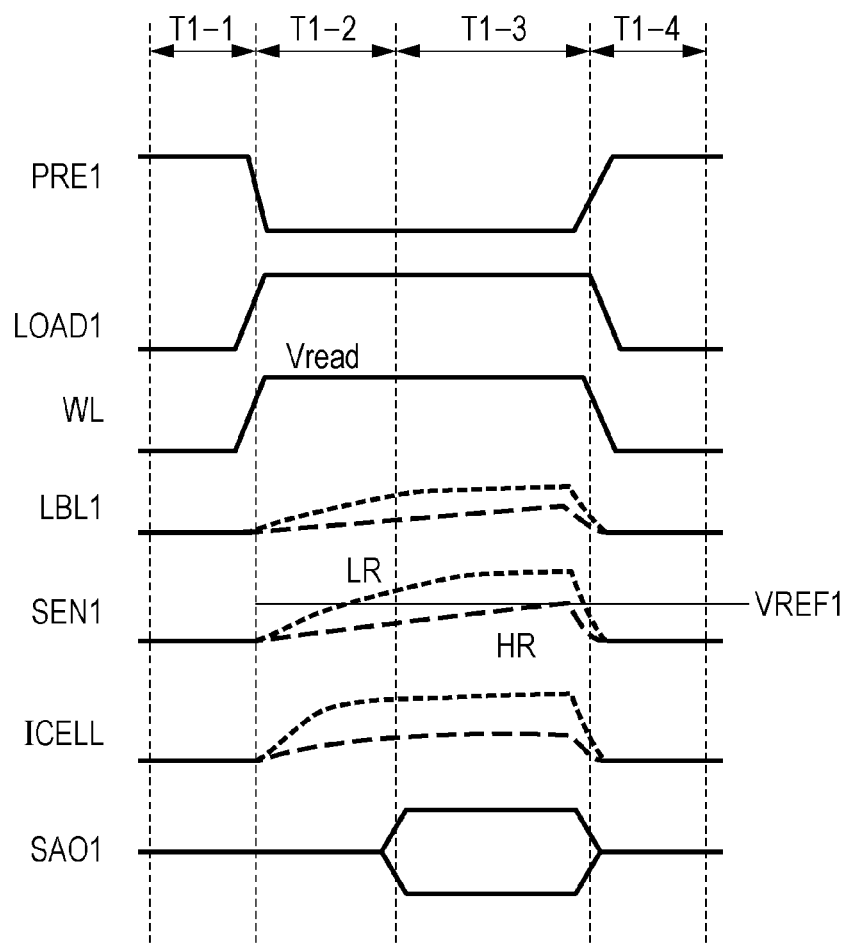
FIG. 10 is a timing chart of an odd-numbered-layer sense amplifier according to the first embodiment.

FIG. 10 illustrates the operation timings of the odd-numbered-layer sense amplifier according to the first embodiment and is a timing chart illustrating a reading operation when a memory cell in an odd-numbered memory layer of the resistance-change nonvolatile memory device 89 is selected. The following description relates to a case where data is read by selecting a memory cell 62 belonging to an odd-numbered layer.

A time period T1-1 is a pre-charge period in the reading operation. The control signal PRE1 is set to a high level, the odd-numbered-layer NMOS pre-charge transistor 102a is turned on, and the control signal LOAD1 is set to a low level, so that the odd-numbered-layer NMOS load transistor 101a is set to an off state and the word lines 92 are set to GND, whereby the first-layer local bit lines 93a and the node SEN1 are pre-charged to the GND level.

In this case, an electric current ICELL flowing to the target memory cell 62 is zero. Moreover, output data from the output terminal SAO1 of the odd-numbered-layer sense amplifier 84a is undefined.

A time period T1-2 is a sense period in which data is read from the selected memory cell 62. By switching the control signal PRE1 to a low level and the control signal LOAD1 to a high level, the odd-numbered-layer NMOS pre-charge transistor 102a is turned off and the odd-numbered-layer NMOS load transistor 101a is turned on. Furthermore, a read voltage Vread is applied to a word line 92 to be selected.

Then, a voltage in the HR direction that causes the second electrode 10a to become positive with reference to the first electrode 10d is applied to the selected memory cell 62, so that electric current starts flowing to the selected memory cell 62 from the word line 92 toward the first-layer local bit line 93a (see FIG. 9). In this case, the amount of electric current flowing to the selected memory cell 62 varies depending on whether a set resistance value thereof is the high resistance state or the low resistance state. With regard to the direction in which the electric current ICELL flows to the memory cell 62, the direction in which the electric current ICELL flows out from the word line 92 is indicated as positive, whereas the direction in which the electric current ICELL flows into the word line 92 is indicated as negative.

As a result, charging to the first-layer local bit line 93a and the node SEN1 starts, so that the electric potential starts to increase from the electric potential in the time period T1-1. In this case, the rate of increase varies depending on whether the set resistance value of the selected memory cell 62 is the high resistance state or the low resistance state.

A time period T1-3 is a period in which the data is determined by and output from the odd-numbered-layer comparator 103a. The electric potentials of the node SEN1 and the reference voltage VREF1 connected to input terminals of the odd-numbered-layer comparator 103a are compared, and it is determined whether the data is "0" or "1" in accordance with the magnitude relationship therebetween. Then, the data is output to the output terminal SAO1.

Subsequently, the control signal PRE1 is set to a high level and the control signal LOAD1 is set to a low level again in a time period T1-4, so that the odd-numbered-layer NMOS pre-charge transistor 102a is turned on and the odd-numbered-layer NMOS load transistor 101a is turned off. By setting the word lines 92 and the first-layer local bit lines 93a to GND, the node SEN1 is pre-charged to the GND level, whereby the data reading operation from the odd-numbered-layer memory cell is completed.

Accordingly, the odd-numbered-layer sense amplifier 84a functions as a charge-type sense amplifier circuit that detects a voltage that increases as a result of charging via a selected memory cell.

When Memory Cell in Even-Numbered Memory Layer is Selected

Figure 11:
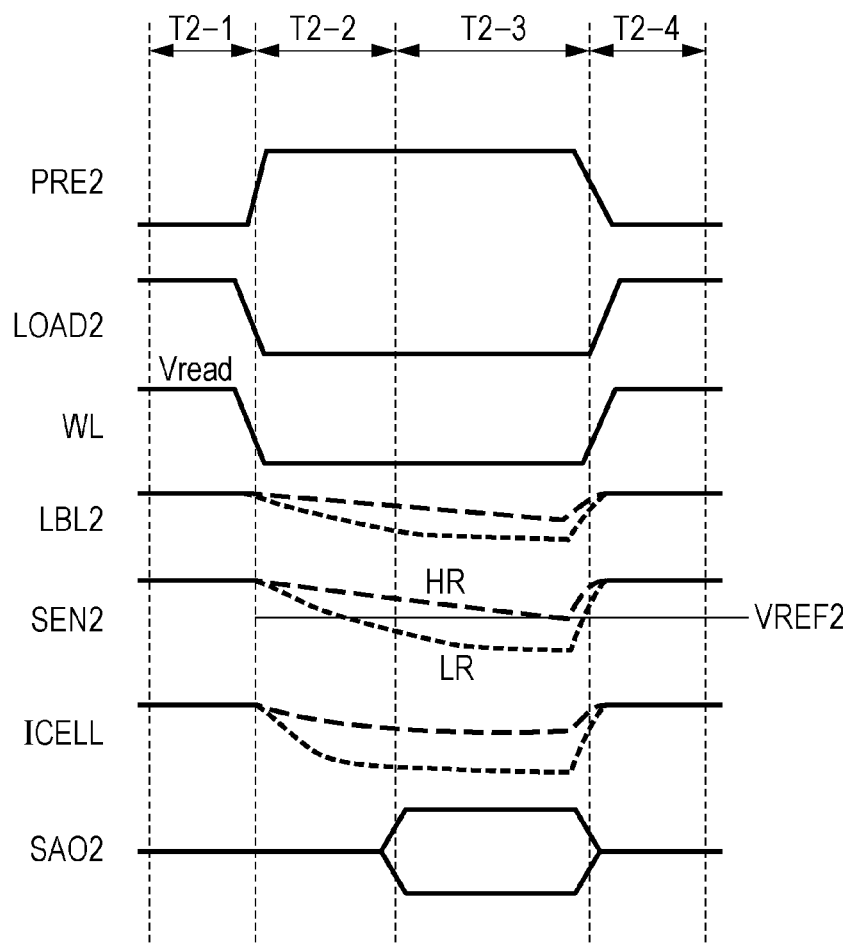
FIG. 11 is a timing chart of an even-numbered-layer sense amplifier according to the first embodiment.

FIG. 11 illustrates the operation timings of the even-numbered-layer sense amplifier according to the first embodiment and is a timing chart illustrating a reading operation when a memory cell in an even-numbered memory layer of the resistance-change nonvolatile memory device 89 is selected. The following description relates to a case where data is read by selecting a memory cell 62 belonging to an even-numbered layer.

A time period T2-1 is a pre-charge period in the reading operation. The control signal PRE2 is set to a low level, the even-numbered-layer PMOS pre-charge transistor 102b is turned on, and the control signal LOAD2 is set to a high level, so that the even-numbered-layer PMOS load transistor 101b is set to an off state and the word lines 92 are set to Vread, whereby the second-layer local bit lines 93b and the node SEN2 are pre-charged to the Vread level.

A time period T2-2 is a sense period in which data is read from the selected memory cell 62. By switching the control signal PRE2 to a high level and the control signal LOAD2 to a low level, the even-numbered-layer PMOS pre-charge transistor 102b is turned off and the even-numbered-layer PMOS load transistor 101b is turned on. Furthermore, GND is applied to a word line 92 to be selected.

Then, a voltage in the HR direction that causes the second electrode 10a to become positive with reference to the first electrode 10d is applied to the selected memory cell 62, so that electric current starts flowing to the selected memory cell 62 from the second-layer local bit line 93b toward the word line 92. In this case, the amount of electric current flowing to the selected memory cell 62 varies depending on whether a set resistance value thereof is the high resistance state or the low resistance state. As a result, discharging from the second-layer local bit line 93b and the node SEN2 starts, so that the electric potential starts to decrease from the electric potential in the time period T2-2. In this case, the rate of decrease varies depending on whether the set resistance value of the selected memory cell 62 is the high resistance state or the low resistance state.

A time period T2-3 is a period in which the data is determined by and output from the even-numbered-layer comparator 103b. The electric potentials of the node SEN2 and the reference voltage VREF2 connected to input terminals of the even-numbered-layer comparator 103b are compared, and it is determined whether the data is "0" or "1" in accordance with the magnitude relationship therebetween. Then, the data is output to the output terminal SAO2.

Subsequently, the control signal PRE2 is set to a low level and the control signal LOAD2 is set to a high level again in a time period T2-4, so that the even-numbered-layer PMOS pre-charge transistor 102b is turned on and the even-numbered-layer PMOS load transistor 101b is turned off. By setting the word lines 92 and the first-layer local bit lines 93a to Vread, the node SEN2 is pre-charged to the Vread level, whereby the data reading operation from the even-numbered-layer memory cell is completed.

Accordingly, the even-numbered-layer sense amplifier 84b functions as a discharge-type sense amplifier circuit that detects a voltage that increases as a result of discharging via a selected memory cell.

As described above, with regard to the resistance-change nonvolatile memory device 89, in the multilayer cross-point memory cell array having identical structures in the Z direction, the sense amplifiers are switched so that the direction in which electric current flows to each of the memory cells in an odd-numbered layer and an even-numbered layer is the same with respect to the memory cell itself (the direction in which electric current flows from a word line to a bit line is reversed between an odd-numbered layer and an even-numbered layer). Thus, when performing reading by selecting a memory cell in any one of the layers, a voltage in the HR direction that causes the second electrode to become positive with reference to the first electrode is applied to the selected memory cell, so that the reading operation can be performed from an electric-current direction that does not cause the resistance value of the resistance change element to fluctuate during the reading operation.

Although two types of sense amplifiers with different electric-current directions are provided as the odd-numbered-layer sense amplifier and the even-numbered-layer sense amplifier in the first embodiment, the sense amplifiers are not limited thereto.

For example, by manufacturing each memory cell in a symmetrical structure in the vertical direction (i.e., the laminating direction) with respect to a word line, a reading operation in which the resistance value does not fluctuate can be achieved with only one of the sense amplifiers.

Furthermore, depending on the assumed intended use of the resistance-change nonvolatile memory device 89, a reading operation may be performed by applying a voltage in the LR direction, which causes the first electrode 10d to become positive with reference to the second electrode 10a, to a memory cell in any one of the memory layers. Such a reading operation is suitable when, for example, the memory cell array is used as a programmable read-only memory (ROM) and the assumed number of times a writing operation is to be performed on each memory cell is limited (e.g., only once or several times).

For example, such a reading operation may be performed by changing the timings for turning on the odd-numbered-layer switch element 95a, the even-numbered-layer switch element 95b, the odd-numbered-layer selection switch element 96a, and the even-numbered-layer selection switch element 96b such that reading from a memory cell in an even-numbered memory layer is performed using the odd-numbered-layer sense amplifier 84a and reading from a memory cell in an odd-numbered memory layer is performed using the even-numbered-layer sense amplifier 84b.

Second Embodiment

Configuration of Resistance-Change Nonvolatile Memory Device

Figure 12:
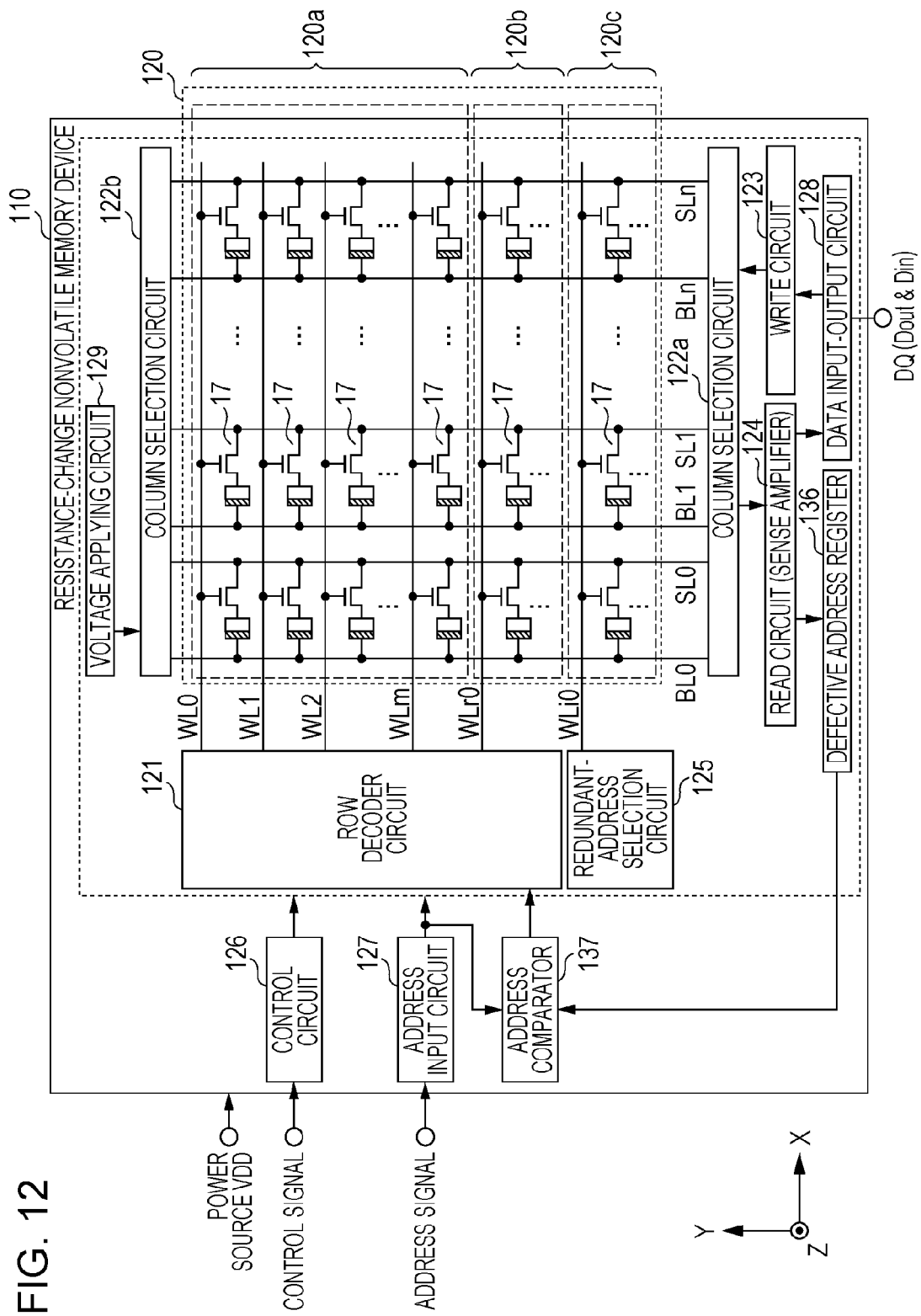
FIG. 12 illustrates the configuration of a resistance-change nonvolatile memory device according to a second embodiment.

FIG. 12 illustrates the configuration of a resistance-change nonvolatile memory device 110 according to a second embodiment. A memory cell array in the resistance-change nonvolatile memory device 110 according to the second embodiment is constituted of 1T1R memory cells.

As shown in FIG. 12, the resistance-change nonvolatile memory device 110 according to the second embodiment includes a memory cell array 120 constituted by using the 1T1R memory cells shown in FIG. 1. The memory cell array 120 is divided into three regions, namely, a main cell region 120a where writing of actual data is performed, a redundant cell region 120b provided with redundant memory cells for substituting for defective memory cells occurring within the main cell region 120a, and a redundant-address-information region 120c for storing address information of a redundant memory cell that has substituted for a defective memory cell occurring in the main cell region 120a.

Furthermore, the resistance-change nonvolatile memory device 110 includes a row decoder circuit 121 that selects one word line from a plurality of word lines connected to the main cell region 120a or the redundant cell region 120b, and a redundant-address selection circuit 125 that selects one word line from a plurality of word lines connected to the redundant-address-information region 120c. The resistance-change nonvolatile memory device 110 further includes column selection circuits 122a and 122b that select one bit line and one source line from a plurality of bit lines and a plurality of source lines and apply a predetermined voltage in each operation. Moreover, the resistance-change nonvolatile memory device 110 includes a write circuit 123 that writes data into a selected memory cell, and a read circuit 124 that detects an amount of electric current flowing to the bit line or the source line so as to perform a determination process on the data. Furthermore, the resistance-change nonvolatile memory device 110 includes a data input-output circuit 128 that performs an input-output process of input-output data.

Moreover, the resistance-change nonvolatile memory device 110 includes an address input circuit 127 that receives an address signal input from the outside, and a control circuit 126 that controls the operation of the memory cell array 120 based on a control signal input from the outside. Furthermore, the resistance-change nonvolatile memory device 110 includes a voltage applying circuit 129 that applies a voltage set for the memory cell in each operation to the bit line and the source line.

Each of the row decoder circuit 121, the redundant-address selection circuit 125, and the column selection circuits 122a and 122b is an example of a selection circuit that selects an arbitrary memory cell as a selected memory cell from the memory cell array 120.

The main cell region 120a, the redundant cell region 120b, and the redundant-address-information region 120c in the memory cell array 120 are respectively connected to different word lines, and the same columns in all of the regions are commonly connected to the same bit lines and the same source lines. In the memory cell array 120, bit lines BL0, BL1, BL2, and so on are arranged so as to intersect with a plurality of word lines WL0, WL1, WL2, and so on in the main cell regions 120*a*, word lines WLr0, WLr1, WLr2, and so on in the redundant cell region 120*b*, and word lines WLi0, WLi1, WLi2, and so on in the redundant-address-information region 120*c*. 1T1R memory cells 17 are provided in correspondence with the points where the bit lines BL0, BL1, BL2, and so on intersect with the word lines WL0, WL1, WL2, and so on in the main cell region 120*a*, the word lines WLr0, WLr1, WLr2, and so on in the redundant cell region 120*b*, and the word lines WLi0, WLi1, WLi2, and so on in the redundant-address-information region 120*c*. Source lines SL0, SL1, SL2, and so on are arranged parallel to the bit lines BL0, BL1, BL2, and so on.

The gate terminal of the transistor in each memory cell 17 is connected to a word line, and the terminal 16 (see FIG. 1) of the transistor that is not connected to the resistance change element 10 is connected to a source line. Each bit line is connected to the terminal 12 at the second electrode (i.e., the upper electrode) 10*a* side of the corresponding resistance change element 10.

The terminals 12 and 16 of each memory cell 17 serve as opposite ends of the memory cell 17, and the bit lines and the source lines are examples of first wires and second wires, respectively. Each of the main cell region 120*a* and the redundant cell region 120*b* is an example of a first memory area, whereas the redundant-address-information region 120*c* is an example of a second memory area.

The address input circuit 127 outputs an input address signal to the row decoder circuit 121 or the redundant-address selection circuit 125. Based on this address signal, the row decoder circuit 121 or the redundant-address selection circuit 125 selects one word line from the plurality of word lines, and each of the column selection circuits 122*a* and 122*b* selects one bit line or one source line, which are different from each other, from the plurality of bit lines or the plurality of source lines. For example, if the column selection circuit 122*a* selects a bit line, the column selection circuit 122*b* selects a source line. If the column selection circuit 122*a* selects a source line, the column selection circuit 122*b* selects a bit line. Accordingly, a memory cell is selected in accordance with the address signal.

Based on an input control signal, the control circuit 126 performs a setting process for connecting a source line or a bit line to each of the column selection circuits 122*a* and 122*b*, and causes the write circuit 123 to operate when performing a writing operation or the read circuit 124 to operate when performing a reading operation. A voltage required for each operation is set by the voltage applying circuit 129.

A defective address register 136 reads data from the redundant-address-information region 120*c* via the read circuit 124 and stores address information thereof. An address comparator 137 compares the address information in the defective address register 136 with address information in the address input circuit 127. If the two pieces of address information match, the address comparator 137 commands the row decoder circuit 121 to select the redundant cell region 120*b*.

Figure 13:
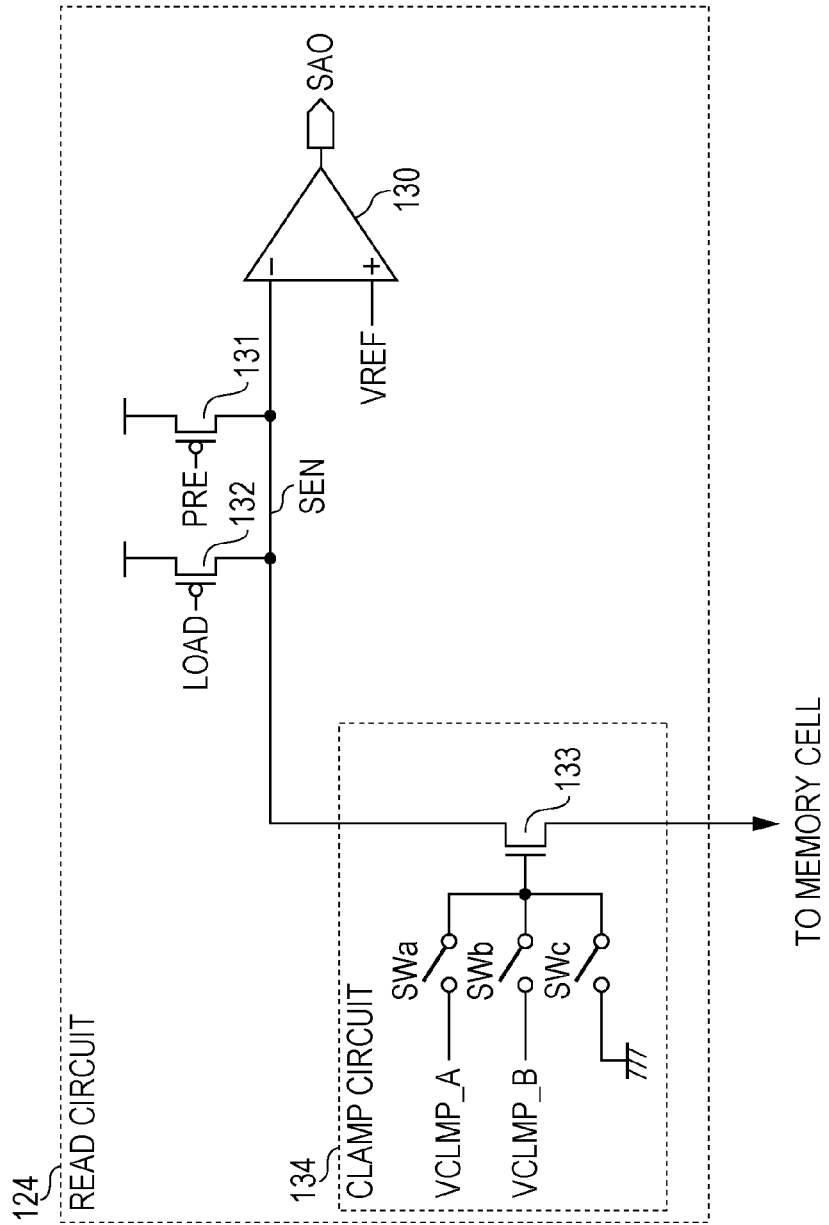
FIG. 13 illustrates the configuration of a read circuit in the resistance-change nonvolatile memory device according to the second embodiment.

FIG. 13 illustrates the configuration of the read circuit 124 in the resistance-change nonvolatile memory device 110 according to the second embodiment.

The read circuit 124 has a discharge-type sense amplifier circuit. The sense amplifier circuit includes a comparator 130, a pre-charge PMOS transistor 131, a load PMOS transistor 132, and a clamp NMOS transistor 133. The pre-charge PMOS transistor 131 has a gate terminal connected to a pre-charge control signal PRE, a source terminal connected to a power source VDD, and a drain terminal connected to a node SEN. The load PMOS transistor 132 has a gate terminal connected to a load control signal LOAD, a source terminal connected to the power source VDD, and a drain terminal connected to the node SEN. The clamp NMOS transistor 133 has a source terminal and a drain terminal. One of the terminals is connected to the node SEN, whereas the other terminal is connected to the memory cells.

A clamp circuit 134 includes the clamp NMOS transistor 133 and switches SWa, SWb, and SWc.

A gate terminal of the clamp NMOS transistor 133 is connected to the switches SWa, SWb, and SWc. The switch SWa is connected to a voltage source VCLMP_A, the switch SWb is connected to a voltage source VCLMP_B having a voltage value larger than that of the voltage source VCLMP_A, and the switch SWc is connected to a GND terminal. By switching among these three voltage sources, the voltage to be applied to a memory cell during a reading operation can be adjusted.

Operation of Resistance-Change Nonvolatile Memory Device

Figure 14:
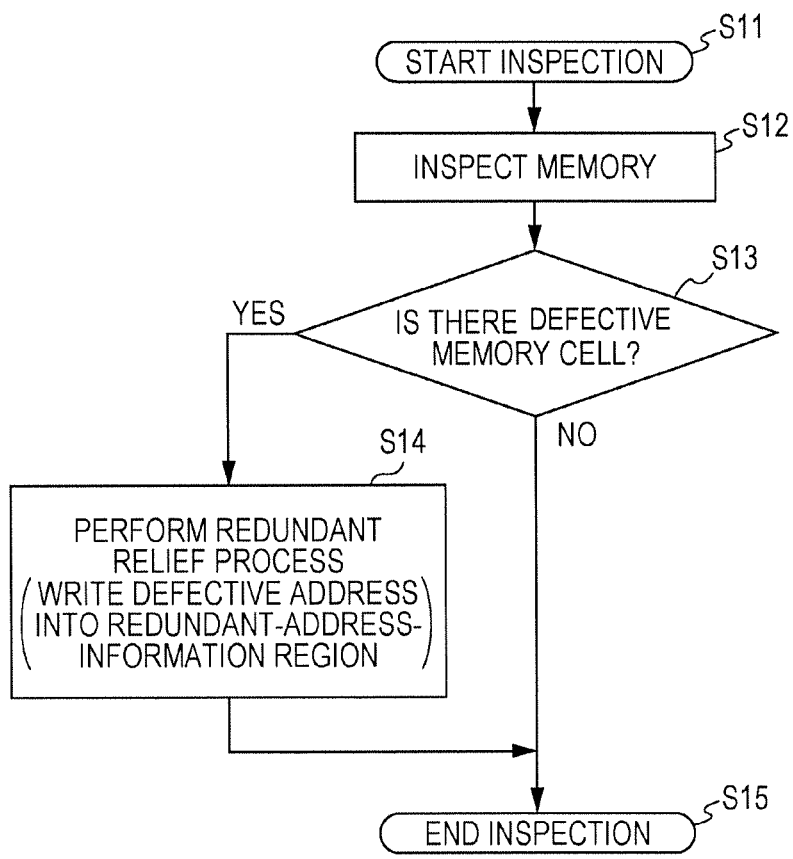
FIG. 14 is a flowchart illustrating the operation of a memory cell array according to the second embodiment (during a manufacturing process)
Figure 15:
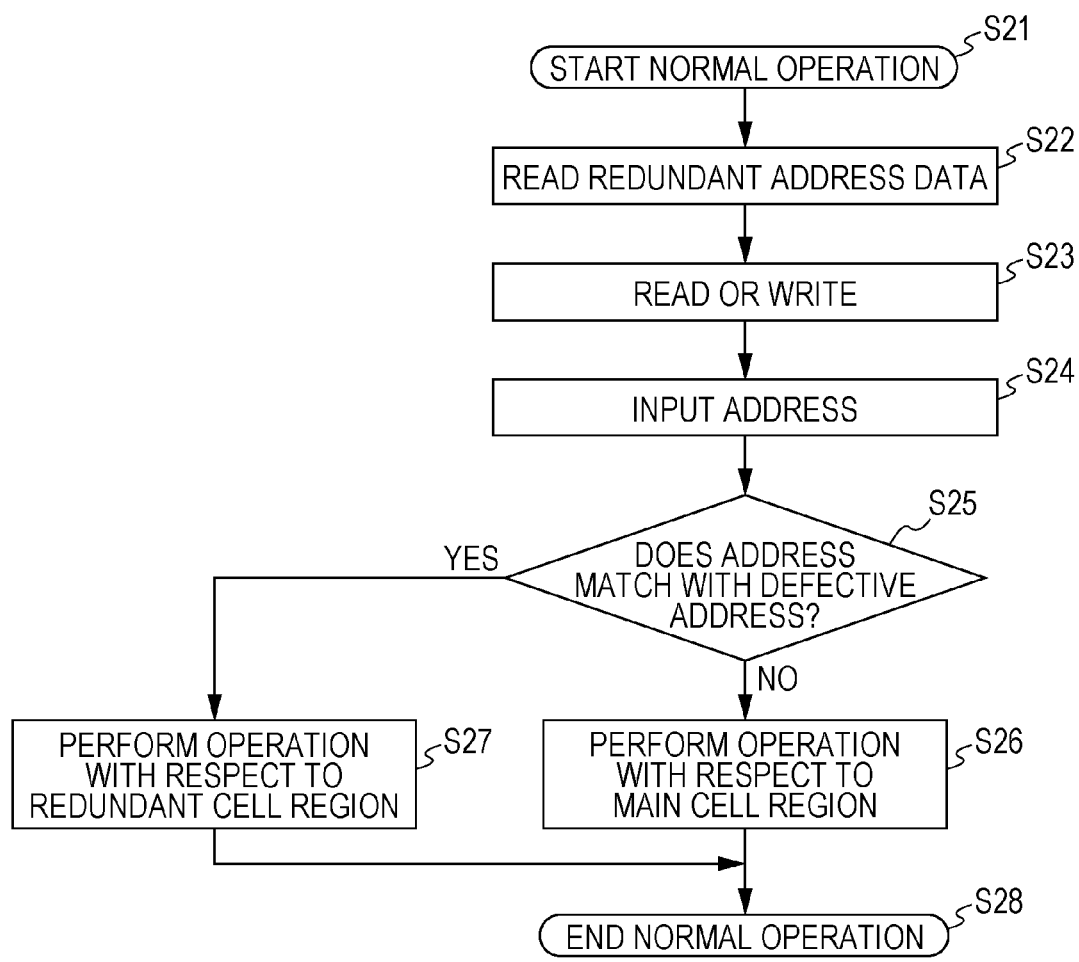
FIG. 15 is a flowchart illustrating the operation of the memory cell array according to the second embodiment (during a normal operation)

Next, the system of the resistance-change nonvolatile memory device 110 according to the second embodiment and a reading operation in each memory cell array region will be described with reference to flowcharts in FIGS. 14 and 15. FIG. 14 is a flowchart illustrating the operation of the memory cell array according to the second embodiment (during a manufacturing process). FIG. 15 is a flowchart illustrating the operation of the memory cell array according to the second embodiment (during a normal operation).

A reading method of the resistance-change nonvolatile memory device according to the second embodiment varies between when performing an inspection in the manufacturing process shown in FIG. 14 and when performing the normal operation shown in FIG. 15.

In an inspection (S11) in the manufacturing process in FIG. 14, an inspection (S12) of the memory cells in the main cell region 120*a* of the memory cell array 120 commences after the product has been manufactured. As a result of this inspection, if a defective memory cell is detected in the main cell region 120*a* (Yes in S13), an operation for substituting a predetermined memory cell in the redundant cell region 120*b* for the defective memory cell in the main cell region 120*a* is performed. In this operation, allocation information for associating the address of the defective memory cell in the main cell region 120*a* with the address of the memory cell in the redundant cell region 120*b* substituted for the defective memory cell is written into a memory cell in the redundant-address-information region 120*c*, so that a redundant relief process is completed (S14). When all of the memory cells in the main cell region 120*a* are inspected and the aforementioned redundant relief process is performed, the inspection ends (S15).

FIG. 15 is a flowchart illustrating an operation treated as a normal operation of the memory cell array 120 after the product inspection in FIG. 14 is completed.

In a normal operation (S21), when the power source VDD is input to the resistance-change nonvolatile memory device 110, a reading operation (S22) is first performed only once on the redundant-address-information region 120*c*, and the read information is stored into the defective address register 136. In a subsequent reading or writing operation (S23), address information input to the address input circuit 127 (S24) and the information in the defective address register 136 are compared by the address comparator 137 on a case-by-case basis. If the two pieces of information do not match (No in S25), each operation is performed with respect to the address in the main cell region 120a (S26). If the two pieces of information match (Yes in S25), since the bit accessing the main cell region 120a is determined to be a defective bit, the memory cell in the redundant cell region 120b allocated at the time of the inspection is accessed, so that the commanded reading or writing operation is performed (S27). By performing this control, a redundant relief process for relieving a defective bit occurring in the main cell region is implemented (S28).

As described above, a writing operation is performed on the redundant-address-information region 120c only once or several times mainly at the time of the inspection in the manufacturing process. Thus, a rewriting operation is not performed many times. Furthermore, during a normal operation, only a reading operation is performed.

Next, a detailed reading operation in the memory cell array in each region will be described.

Reading Operation in Main Cell Region and Redundant Cell Region

A reading operation in the main cell region 120a will be described with reference to a circuit configuration diagram in FIG. 16 and an operation timing chart in FIG. 18.

Figure 16:
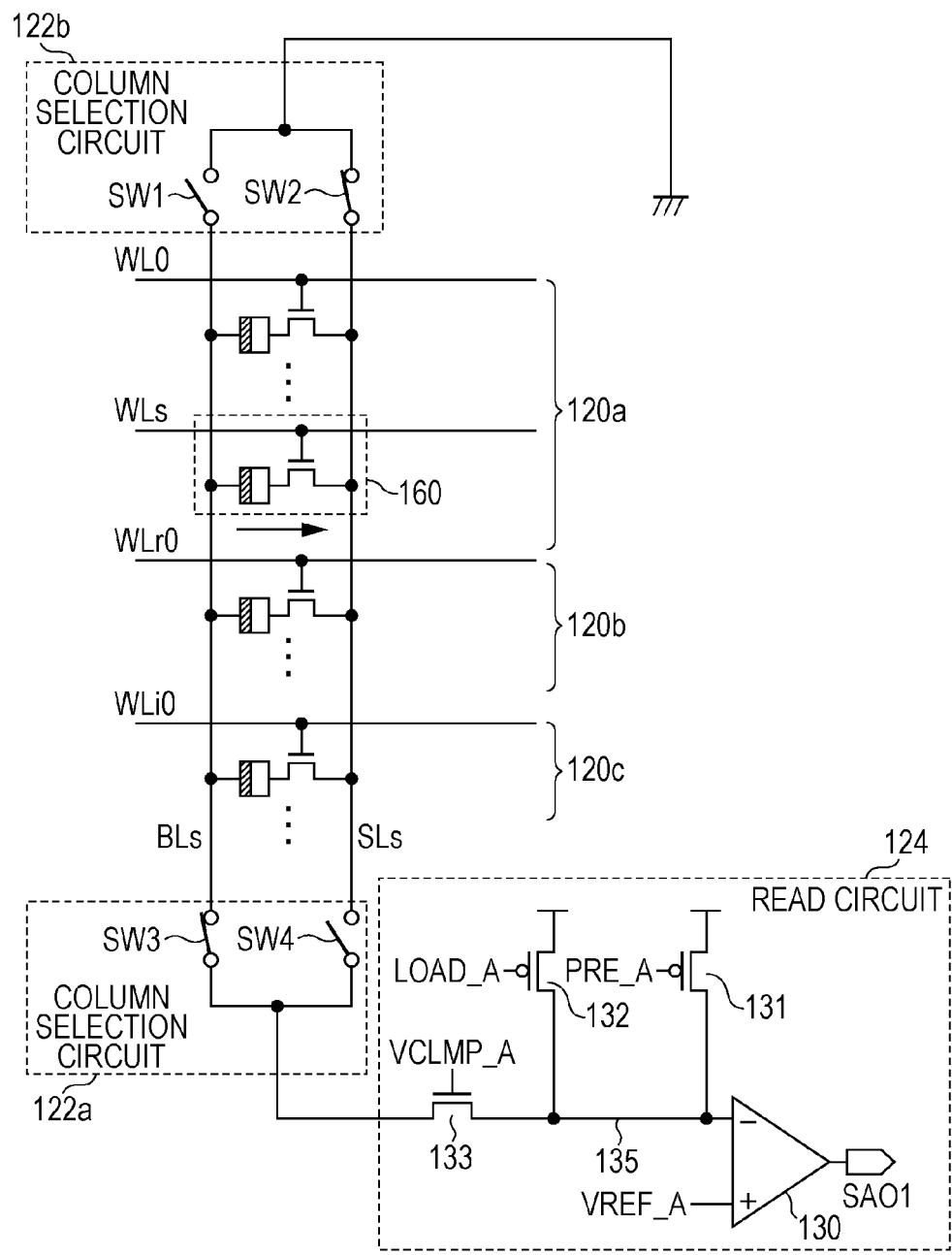
FIG. 16 is a circuit configuration diagram showing the reading operation from a main cell region and a redundant cell region according to the second embodiment.

FIG. 16 is a circuit configuration diagram corresponding to when reading from the main cell region and the redundant cell region according to the second embodiment. More specifically, FIG. 16 is a circuit configuration diagram corresponding to when a memory cell in the main cell region 120a is to be read by the read circuit 124 constituted of a sense amplifier circuit connected, via the column selection circuit 122b, to a portion of the memory cell array connected to a bit line BLs and a selection source line SLs.

When reading from the main cell region 120a, a switch SW1 is turned off and a switch SW2 is turned on in the column selection circuit 122b, so that the selection source line SLs is connected to GND. In the column selection circuit 122a, a switch SW3 is turned on and a switch SW4 is turned off, so that the bit line BLs is connected to the read circuit 124.

The gate terminal of the clamp NMOS transistor 133 receives the voltage source VCLMP_A during the reading operation.

Figure 18:
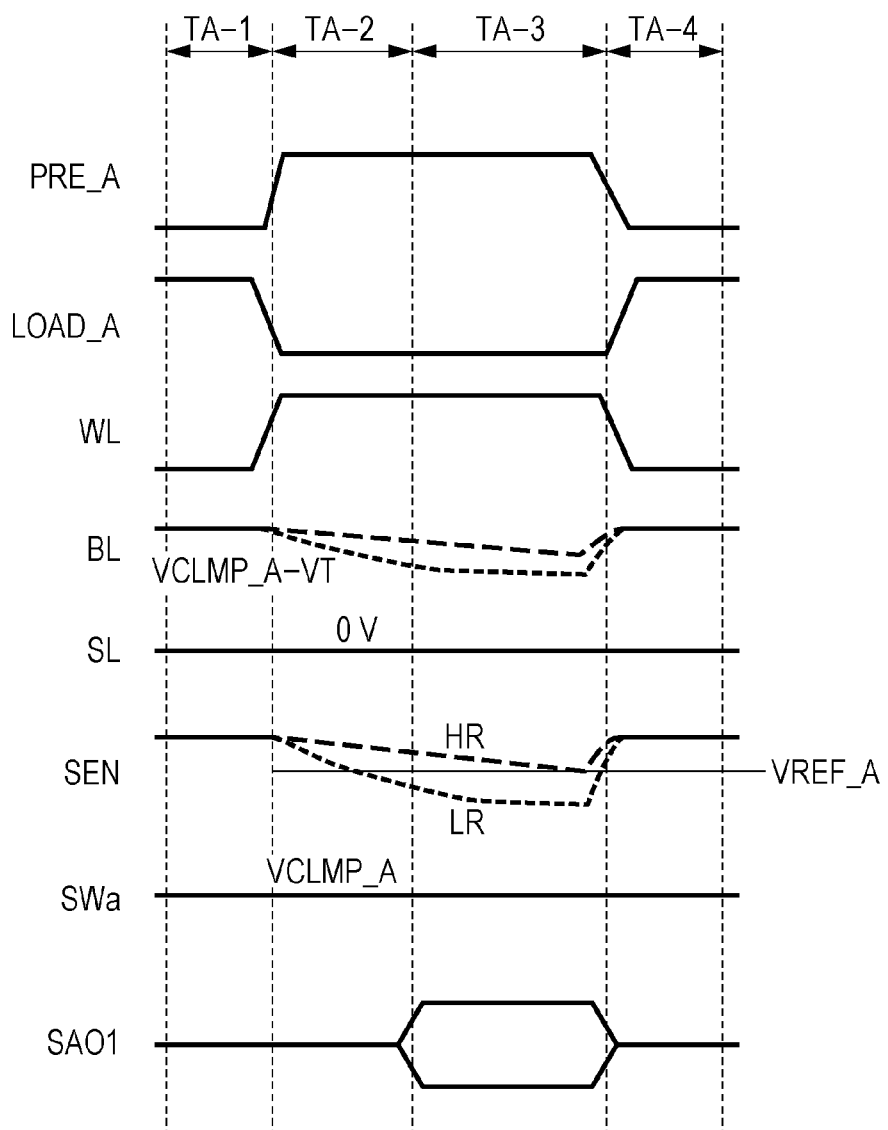
FIG. 18 is a timing chart showing the reading operation from the main cell region and the redundant cell region according to the second embodiment.

FIG. 18 is a timing chart corresponding to when reading from the main cell region and the redundant cell region according to the second embodiment.

In a pre-charge period indicated by a time period TA-1, a control signal PRE_A is at a low level and the pre-charge PMOS transistor 131 is in an on state, whereas a control signal LOAD_A is at a high level and the load PMOS transistor 132 is in an off state. Furthermore, the word lines WL are at a low level and the NMOS transistor 15 is in an off state.

A gate terminal of the clamp circuit 134 is connected to the switch SWa and is supplied with a voltage from VCLMP_A, so that the bit line BLs is pre-charged to an electric potential obtained by subtracting a threshold voltage VT of the clamp NMOS transistor 133 from VCLMP_A, and the node SEN is pre-charged to VDD.

In a sense period indicated by a time period TA-2, the pre-charge PMOS transistor 131 is set to an off state by setting the control signal PRE_A to a high level, so that the control signal LOAD_A is set to a low level, whereby the load PMOS transistor 132 is set to an on state. Furthermore, by setting a word line WLs to be designated to a high level, the NMOS transistor 15 is set to an on state.

Then, a voltage is applied in a direction in which electric current flows from the bit line BLs toward the selection source line SLs via a selected memory cell 160, that is, a direction for increasing the resistance of the resistance change layer 11, whereby discharging commences. In this case, as indicated by a dash line in FIG. 18, discharging occurs in the node SEN such that, when the resistance change element in the selected memory cell is in the high resistance state, the electric potential changes slower than when the resistance change element is in the low resistance state.

In a latch period indicated by a time period TA-3, the comparator 130 compares the electric potential of the node SEN at the start of the time period TA-3 with a reference voltage VREF_A. Data indicating a low level is output to the output terminal SAO1 if the selected memory cell 160 is in the high resistance state, or data indicating a high level is output to the output terminal SAO1 if the selected memory cell 160 is in the low resistance state.

When the output of the data is completed, the word lines are set to a low level and the selection transistor of the selected memory cell 160 is turned off in a time period TA-4, whereby the reading operation ends.

Since the operation with respect to the redundant cell region 120b is the same as that in the main cell region, a description thereof will be omitted here.

Reading Operation in Redundant-Address-Information Region

Next, a reading operation in the redundant-address-information region 120c will be described with reference to a circuit configuration diagram in FIG. 17 and an operation timing chart in FIG. 19.

Figure 17:
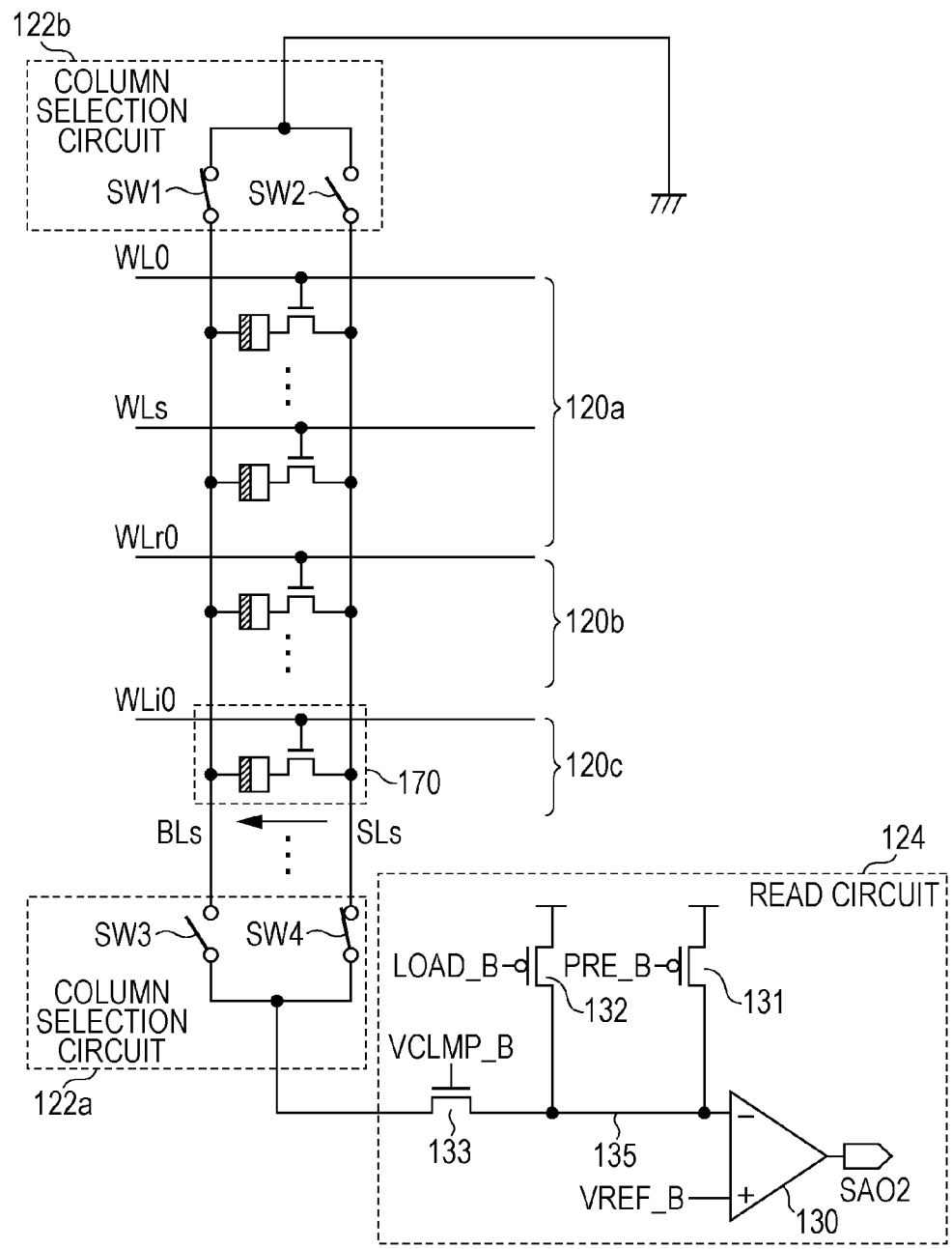
FIG. 17 is a circuit configuration diagram showing the reading operation from a redundant-address-information region according to the second embodiment.

FIG. 17 is a circuit configuration diagram corresponding to when reading from the redundant-address-information region according to the second embodiment. More specifically, FIG. 17 is a circuit configuration diagram corresponding to when a memory cell in the redundant-address-information region 120c is to be read by the read circuit 124 constituted of the sense amplifier circuit connected, via the column selection circuit 122b, to a portion of the memory cell array 120 connected to the bit line BLs and the selection source line SLs.

When reading from the redundant-address-information region 120c, the switch SW1 is turned on and the switch SW2 is turned off in the column selection circuit 122b, so that the bit line BLs is connected to GND. In the column selection circuit 122a, the switch SW3 is turned off and the switch SW4 is turned on, so that the selection source line SLs is connected to the read circuit 124. In other words, when reading from the redundant-address-information region 120c, the connection relationship between the bit line and the source line is opposite from that when reading from the main cell region 120a and the redundant cell region 120b.

The gate terminal of the clamp NMOS transistor 133 receives the voltage source VCLMP_B during the reading operation. The voltage of the voltage source VCLMP_B is set to be higher than the voltage of the voltage source VCLMP_A.

FIG. 19 is a timing chart corresponding to when reading from the redundant-address-information region according to the second embodiment.

In a pre-charge period indicated by a time period TB-1, a control signal PRE_B is at a low level and the pre-charge PMOS transistor 131 is in an on state, whereas a control signal LOAD_B is at a high level and the load PMOS transistor 132 is in an off state. Furthermore, the word lines WL are at a low level and the NMOS transistor 15 is in an off state. The gate terminal of the clamp circuit 134 is connected to the switch SWb and is supplied with a voltage from VCLMP_B, so that the source line SLs is pre-charged to an electric potential obtained by subtracting the threshold voltage VT of the clamp NMOS transistor 113 from VCLMP_B, and the node SEN is pre-charged to VDD.

In a sense period indicated by a time period TB-2, the pre-charge PMOS transistor 131 is set to an off state by setting the control signal PRE_B to a high level, so that the control signal LOAD_B is set to a low level, whereby the load PMOS transistor 132 is set to an on state. Furthermore, by setting a word line WLs to be designated to a high level, the NMOS transistor 15 is set to an on state.

Then, a voltage is applied in a direction in which electric current flows from the selection source line SLs toward the bit line BLs via a selected memory cell 170, that is, a direction for decreasing the resistance of the resistance change layer 11, whereby discharging commences. In this case, as indicated by a dash line in FIG. 19, discharging occurs in the node SEN such that, when the resistance change element in the selected memory cell is in the high resistance state, the electric potential changes slower than when the resistance change element is in the low resistance state.

In a latch period indicated by a time period TB-3, the comparator 130 compares the electric potential of the node SEN at the start of the time period TB-3 with a reference voltage VREF_B. Data indicating a low level is output to the output terminal SAO1 if the selected memory cell 170 is in the high resistance state, or data indicating a high level is output to the output terminal SAO1 if the selected memory cell 170 is in the low resistance state.

When the output of the data is completed, the word lines are set to a low level and the selection transistor of the selected memory cell 170 is turned off in a time period TB-4, whereby the reading operation ends.

Accordingly, in the resistance-change nonvolatile memory device according to the second embodiment, the connection relationship among the bit lines, the source lines, the sense amplifiers, and GND is switched in accordance with the memory area from which data is to be read, so that the direction in which electric current flows to the 1T1R memory cells 17 in the reading operation is changed.

This is because, with regard to the main cell region 120a, the redundant cell region 120b, and the redundant-address-information region 120c according to the second embodiment, the frequency of writing data into memory cells is significantly lower in the redundant-address-information region 120c, as compared with the main cell region 120a and the redundant cell region 120b, and the intended use of the redundant-address-information region 120c as a memory is different therefrom.

The main cell region 120a and the redundant cell region 120b according to the second embodiment are regions where a data writing operation or a data reading operation is repeatedly performed as a normal operation even after a product inspection. In other words, in these regions, a writing operation is also performed in addition to a reading operation. Therefore, a reading operation is performed in view of the stability of a subsequent writing operation by applying a voltage obtained by subtracting the threshold voltage VT from the voltage VCLMP_A, which is relatively low in the HR direction, to the resistance change element, so that the resistance value in the high resistance state does not change toward an even higher resistance value.

On the other hand, in the operation in the redundant-address-information region 120c, once address information of a fixed defective bit detected at the time of the product inspection is written into the redundant-address-information region 120c, access to the redundant-address-information region 120c in a subsequent normal operation is limited to a reading operation. In other words, a writing operation in the redundant-address-information region 120c is performed once or several times during the product inspection, but is not performed thereafter.

In this case, it is effective to read data by applying a relatively high voltage obtained by subtracting the threshold voltage VT from VCLMP_B, which corresponds to a voltage region B in FIG. 2 in the LR direction. The reason for this is as follows. Since it is only necessary to take into account a reading operation, a voltage in the voltage region B is applied to a memory cell having undergone a writing operation in the high resistance state, so that a transition can be made in a direction for further increasing the resistance, whereby a lower read electric-current state can be achieved. Furthermore, a relatively high voltage in the voltage region B is applied to a memory cell having undergone a writing operation in the low resistance state, so that a larger amount of electric current can be made to flow thereto. As a result, the read window can be expanded in the high resistance state and the low resistance state, thereby allowing for increased read stability.

Accordingly, in a usage pattern, such as when a writing operation or a reading operation is to be performed many times on a memory cell, as in the main cell region 120a and the redundant cell region 120b, or when a writing operation or a reading operation is to be performed a smaller number of times but it is necessary to keep the resistance value of the resistance change element within the upper limit and the lower limit of a predetermined range, as in multivalued recording, or when an absolute value of the resistance value of the resistance change element is to be measured, it is preferable to perform the reading operation by applying a relatively low voltage in the HR direction to the resistance change element.

On the other hand, in a usage pattern, such as when a rewriting operation is to be performed only once or several times (e.g., ten times or less) and only a reading operation of the recorded information is to be performed thereafter, as in the redundant-address-information region, it is preferable to perform the reading operation by applying a voltage in the LR direction to the resistance change element. Furthermore, it is more preferable to perform the reading operation by applying a relatively high voltage in the voltage region B indicating the negative resistance characteristic shown in FIG. 2. Other examples of such a usage pattern include reading program information of, for example, an operating system (OS) of a device, reading information, such as birth-date information or personal identification (ID) information, recorded in an integrated-circuit (IC) card, and reading one-time recorded information, such as encryption key information.

Although a method of switching the connection relationships among bit lines, source lines, and sense amplifiers in each memory cell region is used in the second embodiment, the method is not limited thereto.

For example, without performing the switching between a bit line and a source line, the sense amplifier circuit may be configured by preparing two types of sense amplifiers, namely, a discharge type and a charge type, as in the case described in the first embodiment. In this case, these two types of sense amplifiers may be switched when performing a normal reading operation (i.e., reading from the main cell region and the redundant cell region) and when performing reading from the redundant-address-information region.

According to the present disclosure, in a resistance-change nonvolatile memory device having memory cells, each of which is constituted of a switch element and a resistance element that transitions to a higher resistance state when a reading operation is performed on the resistance element particularly in a high resistance state by applying a read voltage thereto that is lower than an LR write voltage in the LR direction, the stability of the reading operation of the nonvolatile memory device can be improved. Therefore, the resistance-change nonvolatile memory device is suitable for achieving a highly-reliable memory used in an electronic apparatus, such as a portable telephone or a notebook-type personal computer.

What is claimed is:

1. A resistance-change nonvolatile memory device comprising:
   a memory cell array having a plurality of memory cells arrayed in a matrix, each of the plurality of memory cells including a resistance change element and a selection element connected in series to the resistance change element, the resistance change element including a first electrode, a second electrode, and a resistance change layer between the first electrode and the second electrode, a resistance value of the resistance change layer changing reversibly based on electrical signals of different polarities applied between the first electrode and the second electrode;
   a selection circuit that selects a memory cell from the memory cell array;
   a write circuit that applies a write voltage to the selected memory cell; and a read circuit that performs a read operation for reading a resistance state of the resistance change element included in the selected memory cell, the read circuit having a sense amplifier circuit,
   wherein in each memory cell of the memory cell array, the selection element has a first terminal, a second terminal, and a control terminal that controls conductivity and non-conductivity between the first terminal and the second terminal, wherein one of the first electrode and the second electrode of the resistance change element is connected to one of the first terminal and the second terminal of the selection element, and the other one of the first electrode and the second electrode of the resistance change element and the other one of the first terminal and the second terminal of the selection element serve as opposite ends of the memory cell,
   wherein the memory cell array is divided into a first memory area and a second memory area, a first wire is commonly connected to one end of a memory cell in the first memory area and one end of a memory cell in the second memory area, and a second wire is commonly connected to the other end of the memory cell in the first memory area and the other end of the memory cell in the second memory area, and
   wherein when the reading operation is performed with respect to the memory cell selected in the first memory area, the selection circuit electrically connects the first wire to the sense amplifier circuit, and when the reading operation is performed with respect to the memory cell selected in the second memory area, the selection circuit electrically connects the second wire to the sense amplifier circuit.

2. The resistance-change nonvolatile memory device according to claim 1,
   wherein the number of times the writing operation is performed with respect to the memory cell selected in the first memory area is larger than the number of times the writing operation is performed with respect to the memory cell selected in the second memory area.

3. The resistance-change nonvolatile memory device according to claim 1,
   wherein the writing operation is performed only one time with respect to the memory cell selected in the second memory area.

4. The resistance-change nonvolatile memory device according to claim 1,
   wherein the memory cell selected in the first memory area comprises a redundant memory cell that substitutes for a defective memory cell.

5. The resistance-change nonvolatile memory device according to claim 4,
   wherein the memory cell selected in the second memory area stores address information indicating a position of the defective memory cell in the memory cell array.

* * * * *